United States Patent
Itoh et al.

(10) Patent No.: US 8,294,510 B2
(45) Date of Patent: Oct. 23, 2012

(54) CMOS CIRCUIT AND SEMICONDUCTOR DEVICE WITH MULTIPLE OPERATION MODE BIASING

(75) Inventors: Kiyoo Itoh, Higashikurume (JP); Masanao Yamaoka, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 144 days.

(21) Appl. No.: 12/521,263

(22) PCT Filed: Dec. 11, 2007

(86) PCT No.: PCT/JP2007/073849
§ 371 (c)(1),
(2), (4) Date: Jun. 25, 2009

(87) PCT Pub. No.: WO2008/078549
PCT Pub. Date: Jul. 3, 2008

(65) Prior Publication Data
US 2010/0097129 A1    Apr. 22, 2010

(30) Foreign Application Priority Data

Dec. 26, 2006 (JP) .................. 2006-349494
Jan. 31, 2007 (JP) .................. 2007-020381

(51) Int. Cl.
*G05F 1/10* (2006.01)
(52) U.S. Cl. ......................... 327/544; 326/31
(58) Field of Classification Search .................. 327/544; 326/80, 81, 31, 33, 34
See application file for complete search history.

(56) References Cited

U.S. PATENT DOCUMENTS

| 5,297,097 A | 3/1994 | Etoh et al. |
| 5,583,457 A | 12/1996 | Horiguchi et al. |
| 5,724,297 A | 3/1998 | Noda et al. |

(Continued)

FOREIGN PATENT DOCUMENTS
JP   2-210688 A   8/1990
(Continued)

OTHER PUBLICATIONS

Y. Nakagome et al, "Review and future prospects of low-voltage RAM circuits", IBM J. Res. & Dev., vol. 47, No. 5/6, pp. 525-552, Sep./Nov. 2003.

*Primary Examiner* — Thomas J Hiltunen
(74) *Attorney, Agent, or Firm* — Miles & Stockbridge P.C.

(57) ABSTRACT

There is provided an output stage circuit including such MOSTs (M) that when their gates and sources are respectively set to an equal voltage, subthreshold leakage currents substantially flow between their drains and sources, wherein upon its deactivation, a voltage is applied to the gate of each of the MOSTs (M) in such a manner than a reverse bias is applied between the gate and source of the MOST (M). That is, when the MOST (M) is of a p channel type, a voltage higher than that of a p type source is applied to its gate. When the MOST (M) is of an n channel type, a voltage lower than that of an n type source is applied to its gate. Upon activation of the circuit, the MOST is held in a reverse bias state or controlled to a forward bias state according to an input voltage. A CMOS circuit and a semiconductor device can be realized each of which is small in leakage current even though its threshold voltage is low and which is operated at high speed and with a small voltage amplitude.

14 Claims, 23 Drawing Sheets

U.S. PATENT DOCUMENTS

| | | | | |
|---|---|---|---|---|
| 5,726,938 | A * | 3/1998 | Okamoto | 365/189.11 |
| 5,821,778 | A * | 10/1998 | Bosshart | 326/95 |
| 5,973,552 | A * | 10/1999 | Allan | 327/544 |
| 6,034,563 | A * | 3/2000 | Mashiko | 327/544 |
| 6,215,159 | B1 * | 4/2001 | Fujita et al. | 257/369 |
| 6,246,266 | B1 * | 6/2001 | Bosshart | 326/98 |
| 6,255,853 | B1 * | 7/2001 | Houston | 326/98 |
| 6,329,874 | B1 * | 12/2001 | Ye et al. | 327/544 |
| 6,492,854 | B1 * | 12/2002 | Ku et al. | 327/202 |
| 6,522,171 | B2 * | 2/2003 | Hanson et al. | 326/95 |
| 6,563,345 | B2 * | 5/2003 | Forbes | 326/98 |
| 6,635,934 | B2 * | 10/2003 | Hidaka | 257/369 |
| 6,838,911 | B2 * | 1/2005 | Forbes | 326/98 |
| 6,850,094 | B2 * | 2/2005 | Yamaguchi | 326/121 |
| 6,876,232 | B2 * | 4/2005 | Yoo | 326/98 |
| 6,900,666 | B2 * | 5/2005 | Kursun et al. | 326/95 |
| 6,999,370 | B2 * | 2/2006 | Luk et al. | 365/226 |
| 7,224,186 | B2 * | 5/2007 | Tsukada | 326/83 |
| 7,266,707 | B2 * | 9/2007 | Ngo et al. | 713/300 |
| 7,288,963 | B2 * | 10/2007 | Nagata | 326/81 |
| 7,515,503 | B2 * | 4/2009 | Lee et al. | 365/230.06 |
| 7,764,087 | B2 * | 7/2010 | Kursun et al. | 326/95 |
| 2004/0070427 | A1 * | 4/2004 | Miyagi | 327/100 |
| 2004/0080340 | A1 | 4/2004 | Hidaka | |
| 2007/0176641 | A1 * | 8/2007 | Kursun et al. | 326/97 |
| 2007/0176673 | A1 * | 8/2007 | Ito | 327/544 |
| 2008/0157842 | A1 * | 7/2008 | Kim | 327/211 |

FOREIGN PATENT DOCUMENTS

| | | |
|---|---|---|
| JP | 6-237164 A | 8/1994 |
| JP | 9-231756 A | 9/1997 |
| JP | 2002-319859 A | 10/2002 |
| JP | 2004-147175 A | 5/2004 |

* cited by examiner

CMOS CIRCUIT AND SEMICONDUCTOR DEVICE WITH MULTIPLE OPERATION MODE BIASING

TECHNICAL FIELD

The present invention relates to a low power circuit, and particularly to a CMOS circuit operable at high speed with a low voltage while suppressing a leakage current to be low.

BACKGROUND ART

Miniaturization of a CMOS circuit and MOS transistors (MOSTs) that configure it is essential to the realization of large scale integration (LSI). The CMOS circuit is important in particular. This is because a CMOS inverter comprising an n channel MOS transistor (Mn: hereinafter called nMOST) and a p channel MOS transistor (Mp: hereinafter called pMOST) both shown in FIG. 29, for example is ideal since either of the MOSTs is brought into conduction but the other thereof is cut off, in terms of both the absence of the flow of a dc penetration current and low power consumption. As examples of documents each having described the CMOS circuit, there are known a patent document 1 and a non-patent document 1.
[Patent Document 1] Japanese Unexamined Patent Publication No. 2002-319859
[Non-Patent Document 1] Y. Nakagome, M. Horiguchi, T. Kawahara, K. Itoh, "Review and future prospects of low-voltage RAM circuits," IBM J. R & D, vol. 47, no. 5/6, pp. 525-552, September/November 2003.

DISCLOSURE OF THE INVENTION

Problems that the Invention is to Solve

With the miniaturization of each MOST, however, such a CMOS circuit has also faced the following large problems. That is, when the MOST is micro-fabricated or scaled down, its withstand voltage is generally reduced. In order to maintain the reliability of the LSI, its operating voltage ($V_{DD}$) must therefore be lowered. Reducing $V_{DD}$ is extremely effective even for a reduction in power consumption at activation of the LSI. This is because power for charging/discharging a load capacitance is proportional to $V_{DD}^2$. A threshold voltage ($V_T$) of each MOST must however be reduced to maintain the speed even when $V_{DD}$ is lowered. This is because a driving current of the MOST is approximately proportional to an effective gate voltage ($V_{DD}-V_T$) and hence the speed is approximately reversely proportional to the effective gate voltage. However, when $V_T$ is reduced, a subthreshold leakage current (hereinafter called leakage current) of each MOST begins to increase exponentially (leakage current increases by one digit by simply reducing $V_T$ by 0.1V). Since it flows through the CMOS circuit as a penetration current, the advantage of low power consumption of the CMOS circuit is lost. Accordingly, there is a lower limit to the possible value of $V_T$ in terms of the leakage current. Although this lower limit value differs according to product specs, it is approximately 0.3V or so in a logical circuit. With its lower limit value, there is a lower limit even to the possible value of $V_{DD}$. In order to achieve a practical speed under such a $V_T$, the lower limit of this $V_{DD}$ has heretofore been considered to be 0.6V or so. Thus, even if the miniaturization of each MOST is pursued, $V_{DD}$ cannot be set to less than or equal to it in terms of the leakage current and the speed. Therefore, the reliability of the MOST is degraded with the miniaturization thereof. Although growing much larger in scale of LSI has been realized by reducing $V_{DD}$ to cope with an increase in power consumption with the miniaturization of each MOST and its large scale, growing much large in the scale of LSI becomes difficult in terms of power consumption because $V_{DD}$ cannot be lowered. It has recently been revealed gradually that variations in $V_T$ in a chip increase with the miniaturization. It has therefore been pointed out that the lower limit of $V_{DD}$ becomes high with the miniaturization. Degradation of the reliability of the MOST and the increase in power are becoming increasingly serious.

An object to be solved is to provide a CMOS circuit and a semiconductor device each of which is small in leakage current even though its threshold voltage $V_T$ is low and which is operated at high speed and with a small voltage amplitude.

The above and other objects and novel features of the present invention will become apparent from the description of the present specification and the accompanying drawings.

Means for Solving the Problems

A summary of typical ones of the inventions disclosed in the present application will be explained in brief as follows: There is provided a dynamic CMOS circuit wherein upon its deactivation, a voltage is applied to the gate of, for example, a low-$V_T$ MOST in such a manner that a reverse bias is applied between the gate and source of the MOST, thereby to reduce a leakage current and wherein upon its activation, the MOST is held in the reverse bias state or controlled to be a forward bias state according to an input voltage, and a load is driven at a low voltage commensurate with the low $V_T$ of the MOST in the forward bias state.

More specifically, there is provided a CMOS circuit which includes such MOSTs that when their gates and sources are respectively set to an equal voltage, subthreshold leakage currents substantially flow between their drains and sources, wherein each of the MOSTs has a first operation mode and a second operation mode, wherein in the first operation mode, a constant voltage irrelevant to an input voltage of the circuit is applied to the gate of the MOST in such a manner that a reverse bias is applied between the gate and source of the MOST, and wherein in the second operation mode, the gate voltage is controlled in such a manner that the MOST is held in the reverse bias state or a forward bias is applied between the gate and source according to the input voltage of the circuit, or there is provided a semiconductor device equipped with the CMOS circuit. Alternatively, there is provided a CMOS circuit which includes such MOSTs that when their gates and sources are respectively set to an equal voltage, subthreshold leakage currents substantially flow between their drains and sources, wherein each of the MOSTs has a first operation mode and a second operation mode, wherein in the first operation mode, a constant voltage irrelevant to an input voltage of the circuit is applied to the gate of the MOST in such a manner that a forward bias is applied between the gate and source of the MOST, and wherein in the second operation mode, the gate voltage is controlled in such a manner that the MOST is held in the forward bias state or a reverse bias is applied between the gate and source according to the input voltage of the circuit or there is provided a semiconductor device equipped with the CMOS circuit.

EFFECTS OF THE INVENTION

Since a leakage current that flows through each MOST at off by a reverse bias can be reduced, and a load can be driven at high speed even at a low operating voltage at on, low power consumption is enabled while maintaining high-speed performance.

EXPLANATION OF REFERENCE NUMERALS

IN/OUT input/output
DTC voltage detector
CVP/CNV voltage converter
IV/IVP/IVN inverters
SW1/SW2 switches
CK1/CK1B/CK2/CK3 clocks
$V_{DD}/V_{SS}$ external source voltages to chip
$V_{DS}/V_{D1}/V_{SS}/V_{SL}/Vref$ internal source voltages generated inside chip
b11/b12 circuit sub blocks
CORE/CORE' internal main circuits
CKG/VC clock generator and source voltage converter
CP comparator

BEST MODE FOR CARRYING OUT THE INVENTION

A CMOS circuit which corresponds to a circuit in which each MOST low in $V_T$ is contained in an output stage, and in which the voltage amplitude of a load of the output stage is smaller than that of the gate of the MOST, or a semiconductor device equipped with the circuit will hereinafter be described in detail.

Figure 1A:
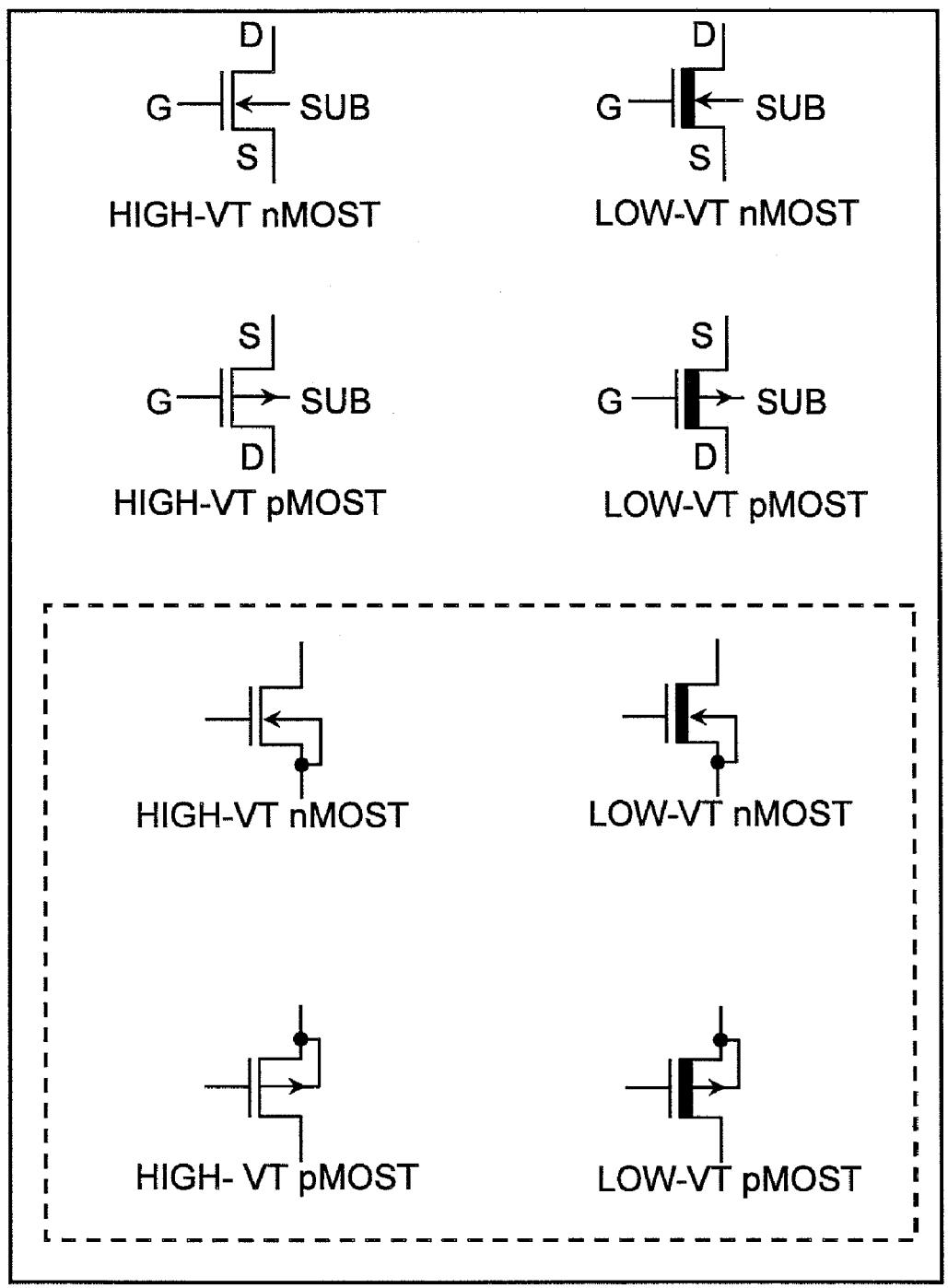
FIG. 1A is an explanatory diagram illustrating circuit symbols of MOSTs different in threshold voltage, which are employed in the present specification.
Figure 1B:
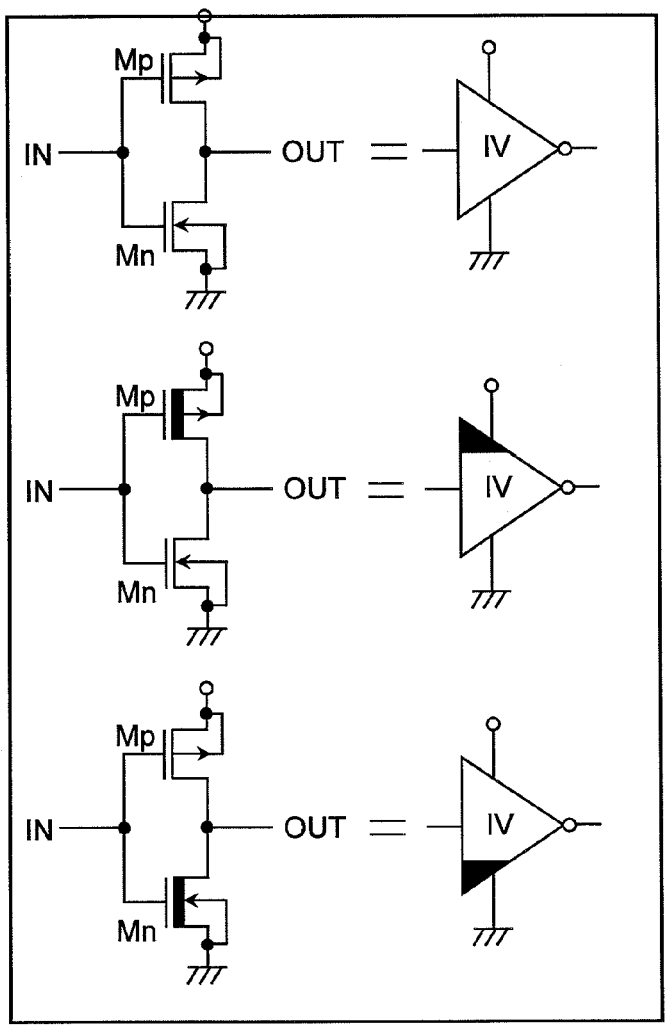
FIG. 1B is an explanatory diagram illustrating circuit symbols of inverters using MOSTs different in threshold voltage, which are employed in the present specification.
Figure 1C:
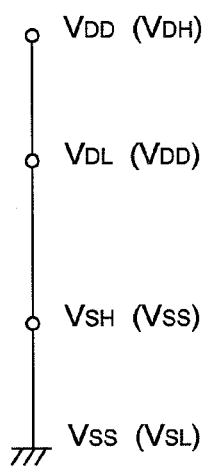
FIG. 1C is an explanatory diagram showing a relationship of voltages applied to each MOST.

As a preparation for describing several embodiments, circuit symbols for MOSTs and inverters are shown below in FIGS. 1A and 1B. MOSTs sufficiently small (0V, for example) in $V_T$ and MOSTs large (0.3V, for example as described above) in $V_T$ are also shown together in FIG. 1A. An arrow indicates a substrate or a well. An nMOST is fixed to the lowest voltage or controlled to be the lowest voltage. A pMOST is fixed to the highest voltage or controlled to be the highest voltage. Incidentally, circuit symbols where the sources of nMOSTs and pMOSTs and the substrate are coupled are shown within a broken-line frame. Here, $V_T$ is a gate voltage based on the source at which each MOST begins to turn on, as well known. Three types of inverters (corresponding to sub inverters to be described in the following sentences) in which the MOSTs low in $V_T$ and the MOSTs large in $V_T$ have been combined are also shown together in FIG. 1B. In the following embodiments, source voltages directly related to a main circuit (CORE), which are supplied from the outside of a chip (FIG. 28A to be described later) are $V_{DD}$ and $V_{SS}$ unless otherwise described in particular. When, for example, $V_{DD}$ is 0.9V and $V_{SS}$ is 0V, $V_{DL}$ (0.6V, for example) and $V_{SH}$ (0.3V) are internal source voltages generated inside the chip using these $V_{DD}$ and $V_{SS}$. A step-up source voltage $V_{DH}$ and a negative voltage $V_{SL}$ can also be generated within the chip from the external power supplies $V_{DD}$ and $V_{SS}$ as indicated in parentheses of FIG. 1C depending on the convenience of design. There are provided, for example, $V_{DD}$=0.3V, $V_{SS}$=0V, $V_{DH}$=0.6V, $V_{SL}$=−0.3V, etc. Since a mutual relationship between the magnitudes of voltages is stored even though the voltage settings are changed in this way, the description of the following circuit operations is common.

Figure 2A:
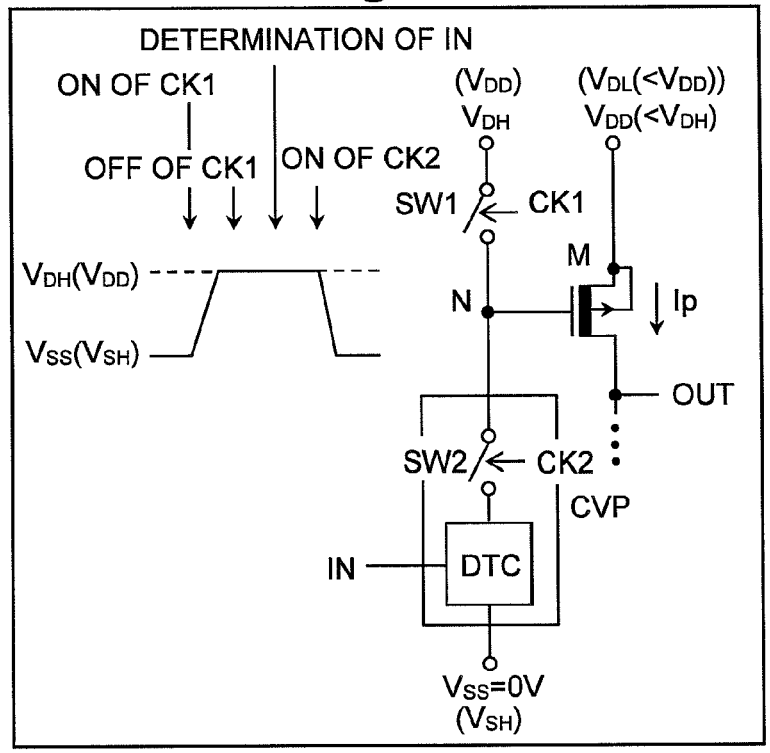
FIG. 2A is a conceptual diagram showing in principle one example of the present invention relative to a pMOST in an output stage circuit.
Figure 2B:
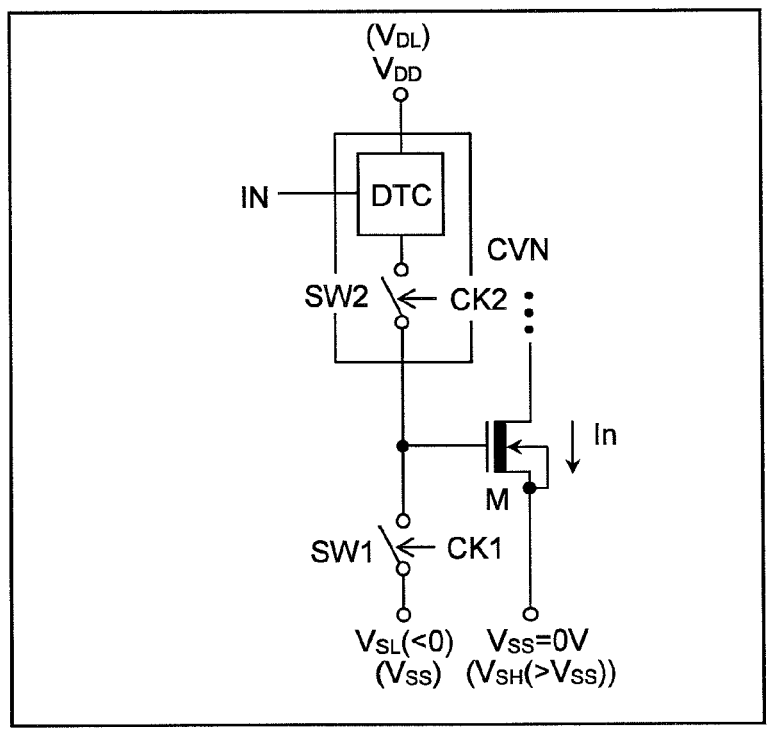
FIG. 2B is a conceptual diagram showing in principle one example of the present invention relative to an nMOST in an output stage circuit.

The concept of the present invention is shown in FIGS. 2A and 2B. Since a large load capacitance $C_L$ (not shown in the figure) must be driven at high speed upon conduction (hereinafter called turning on) of a MOST (M) in each drawing, its channel width is extremely large. It is desired that $V_T$ of the MOST is set as small as possible to provide a further speed-up. For example, $V_T$ is sufficiently smaller than 0.3V referred to above. A depletion type (normally on) is also contained in an extreme example. Caution is however required where $V_T$ is set to less than or equal to 0.3V as described above. This is because when $V_T$ reaches less than or equal to 0.3V or so where the MOST is held in non-conduction (hereinafter called turning off), i.e., the voltage ($V_{GS}$) between the gate and source thereof is 0V, a subthreshold leakage current (hereinafter called leakage current) begins to flow between the drain and source thereof, and the leakage current is sensitive to the magnitude of $V_T$ and becomes large one digit by one digit each time $V_T$ is reduced 100 mV or so. Further, the leakage current is proportional to the channel width. In such an application that the spec of the leakage current is not so strict, the leakage current at the turning off is normally allowable even at $V_T$=0V or so. However, in such an application that the spec of the leakage current at standby is strict as in the case of a portable device or the like, the leakage current might not be allowed. Reducing $V_T$ to less than or equal to 0V still more results in a large problem. If use is however made of the fact that the more a reverse bias is applied between the source and gate of the MOST in a time zone or period to turn off the MOST even though an actual $V_T$ is low, the more $V_T$ can effectively be increased, then the operating voltage $V_{DD}$ can be reduced while the leakage current and speed remain maintained, thus enabling a reduction in power. This is because $V_{DD}$ can be lowered by application of a deep reverse bias as will be described below. Thus, the application of the present invention enables a reduction in such leakage current of the output stage M.

FIG. 2A is an example in which the present invention is applied to a pMOST (M in the figure) of the output stage low in $V_T$. A description will first be made of a case in which a high voltage $V_{DH}$ is used. Since the pMOST is taken, the normal enhancement type (normally off) MOST is brought to a negative value in $V_T$. The MOST is however of such a MOST low in $V_T$ that a subthreshold leakage current substantially flows between the drain and source when the gate and source are rendered equal in voltage. A small or low voltage $V_{DD}$ is applied to the source of the MOST. DTC is of a detector for detecting an input (IN) voltage. In the time period to turn off the MOST, a switch SW1 is turned on and a switch SW2 is turned off. Thus, since the DTC is separated from a node N of the MOST, i.e., the gate of the MOST, the node N is precharged to a voltage $V_{DH}$ larger than a source voltage $V_{DD}$ of the MOST independent of an input voltage. Thus, since a reverse bias is applied between the gate and source of the MOST by $V_{DH}$−$V_{DD}$, its effective threshold voltage is increased by its bias, thereby resulting in −($V_{DH}$−$V_{DD}$)+$V_T$. In order to perfectly cut off the MOST under this bias condition, the effective threshold voltage $V_T$ may be set to less than or equal to −0.3V as mentioned above:

$$-(V_{DH}-V_{DD})+V_T \leq -0.3V \quad (1)$$

$$V_{DH} \geq (V_{DD}+V_T)+0.3V \quad (2)$$

After the switch SW1 has been turned off, the input (IN) voltage that has been determined up to now, is detected by the DTC in the time period to turn on the MOST and the switch SW2 is turned on, so that the node N remains at $V_{DH}$ or is discharged to $V_{SS}$ (0V). Assuming that the MOST M is turned on upon its discharge and the output OUT has been brought to 0V up to now, the output is charged to $V_{DD}$ by a drain current Ip. The speed τ of charging the load is inversely proportional to the effective gate voltage $V_{DD}+V_T$ of the MOST and approximately expressed as follows:

$$\tau \propto 1/(V_{DD}+V_T) \quad (3)$$

Figure 3:
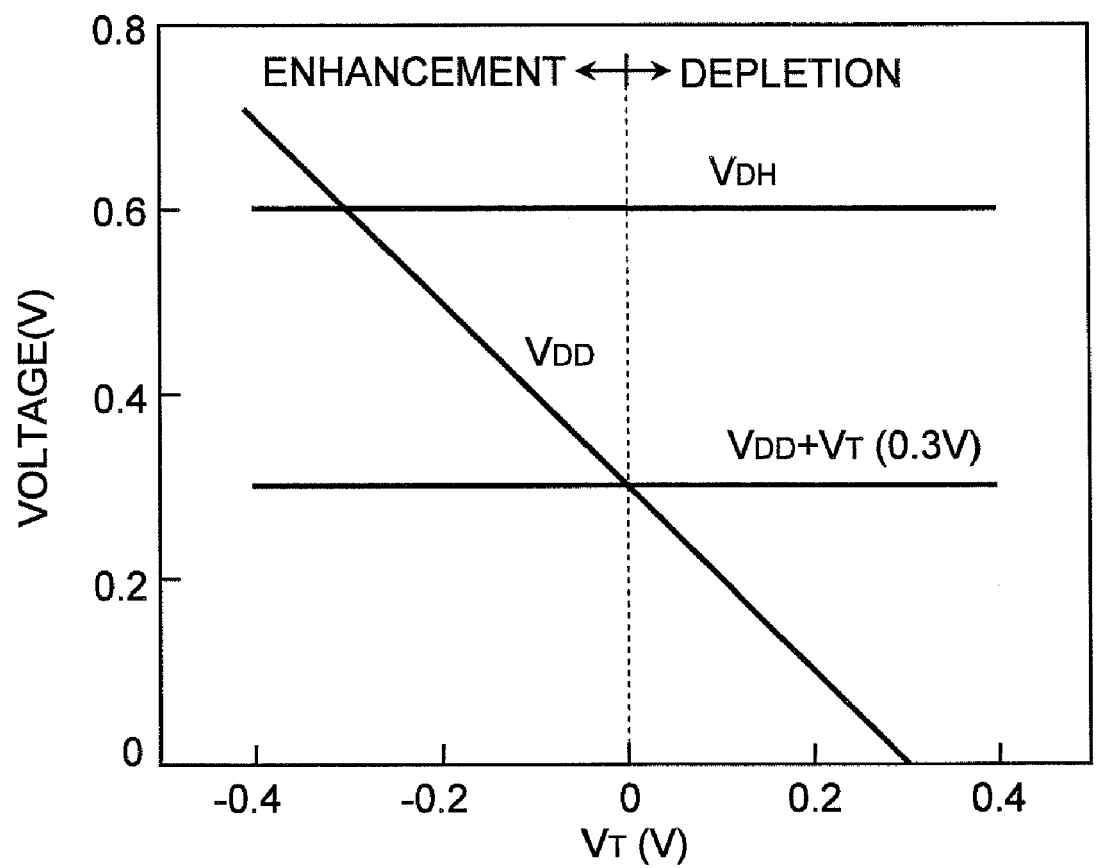
FIG. 3 is an explanatory diagram showing a relationship between threshold voltages and operating voltages of MOSTs.

Thus, as shown in FIG. 3, the more $V_T$ can be lowered, the more $V_{DD}$ can be reduced under 0.3V and a constant effective gate voltage, i.e., a constant speed, thus enabling a reduction in power. When $V_T$ of the enhancement type MOST is reduced from −0.3V to 0V, for example, $V_{DD}$ can be reduced from 0.6V to 0.3V. Further, when a depletion type is taken and $V_T$ is increased from 0V to 0.3V, $V_{DD}$ can be further reduced. If $V_T$=0.2V, for example, then an ultra low-voltage operation of $V_{DD}$=0.1V is also enabled. In order to satisfy this condition while the leakage current at the turning off of the MOST is being reduced, $V_{DH}$ may be set to a constant value (0.6V) or more as is apparent from the equation (2). There is however a case in which since $V_{DH}-V_{DD}$ becomes large with it, i.e., the voltage applied between the gate and source of the MOST becomes large at its turning off, a circuit (shown in FIG. 26) for relaxing an excessive voltage is required as will be described later. In order to bring the MOST to a high speed operation by increasing the effective gate voltage under a constant $V_{DD}$, $V_T$ of the enhancement type MOST may be reduced, preferably, $V_T$ may be made larger using the depletion type MOST. $V_{DH}$ must be made larger as apparent from the equation (2) to suppress a larger leakage current as a matter of course.

Similarly, FIG. 2B is an example using a negative voltage $V_{SL}$, i.e., an example applied to a low-$V_T$ nMOST (M in the figure). If the polarity of the voltage is set in reverse, then the operation thereof can be explained in a manner similar to the pMOST. That is, M is being cut off upon non-selection. This is because, for example, $V_{SL}$ (−0.3V) is applied to the gate of the MOST, $V_{SS}$ (0V) is applied to the source thereof, and $V_T$ (M) is reverse-biased by 0.3V with respect to the MOST of 0V. Upon activation of M, M is forward-biased by 0.3V where the input IN charges the gate voltage to $V_{DD}$ (0.3V), so that a large load driving current In flows. Similarly, assuming that $V_{SL}$ is set to a negative value to bring the leakage current at the turning off to a negligible degree, the following is established:

$$-V_{SL}+V_T \geq 0.3V \quad (4)$$

Since the nMOST is taken, $V_T$ of the enhancement type (normally off) becomes a positive value if the enhancement type is used, whereas if the depletion type (normally on) is taken, its $V_T$ becomes a negative value. Apparently, if the negative voltage $V_{SL}$ is made large at the turning off, then the MOST can be cut off even if $V_T$ of the nMOST is low. If $V_{SL}$ is further made large, then the MOST can be cut off even in the case of the depletion type MOST, i.e., even when $V_T$ is of a negative value. Sine the speed τ of discharging a load of the MOST at its activation is approximately expressed in the following manner, $$\tau=1/(V_{DD}-V_T) \quad (5)$$

the same speed can be realized by a low $V_{DD}$, i.e., low power. Although the lower limit of $V_{DD}$ and the voltage amplitude of the output were 0.6V in the conventional circuit as described above, the circuit can be operated at $V_{DD}$ and voltage amplitude not greater than 0.6V in the present invention.

The above is similar even where internal source voltages $V_{DL}$ and $V_{SH}$ are used. A description will be made with FIG. 2A as an example, for example. Upon non-activation or deactivation, the switch SW2 is turned off by a clock CK2, so that a converter CVP is separated from the node N of the MOST, i.e., the gate thereof. Thus, when the switch SW1 is turned on by a clock CK1, the node N is precharged to a voltage $V_{DD}$ larger than the source voltage $V_{DL}$ of the MOST. In order to set the leakage current of the MOST as small as negligible under such a condition, $V_{DL}-V_{DD}+V_T(M) \leq -0.3V$ must be taken if the threshold voltage of the MOST is set to $V_T(M)$. Here, the larger the difference voltage $V_{DL}-V_{DD}$, the more the above condition is satisfied even at a smaller negative value of $V_T(M)$ of an absolute value. This means that more speeding-up is enabled upon its activation. If the difference voltage is further increased, then a positive value is also allowed for $V_T(M)$. That is, the leakage current of the MOST can be neglected, i.e., cut off even at the depletion type (normally on). Upon the activation, the switch SW1 is turned off by the clock CK1 and the parasitic capacitance of the node N is caused to hold the voltage $V_{DD}$. Subsequently when the switch SW2 is turned on by the clock CK2 after the input IN has been determined, the binary voltage states of the input IN are detected by the detector DTC, and the node N remains at $V_{DD}$ or discharged to $V_{SH}$ according to the result of detection thereof. If the node N is at $V_{DD}$, then the MOST remains cut-off. If the node N is at $V_{SH}$, then the MOST is turned on, so that a large load driving current Ip flows. The smaller the absolute value of $V_T$, the larger the corresponding current. The current further increases at the depletion type (normally on).

According to the principle described based on FIGS. 2A and 2B, in the CMOS circuit containing such a MOST (M) that the subthreshold leakage current substantially flows between the drain and source thereof when the gate and source are set to the equal voltage, the voltage is applied to the gate of the MOST (M) in the time period to turn off the MOST such that the reverse bias is applied between the gate and source of the MOST, and the MOST is held in the reverse bias state or controlled to the forward bias state according to the input voltage in the time period to turn on the MOST. Incidentally, the MOST can take on and off states even at both the activation and deactivation of the semiconductor device comprised of the CMOS circuit. That is, there is a case in which when the circuit is at the deactivation (standby, for example), as shown in FIG. 2A, the node N is brought to $V_{DH}$ (or $V_{DD}$) to apply the reverse bias to the MOST thereby to turn off the MOST, and when the circuit is at the activation, the MOST is held in the reverse bias state (maintained at off) or forward bias state according to the input of the circuit thereby to turn on the MOST. Reversely to the above, there is also a case in which when the circuit is at the deactivation, the node N is brought to 0V to apply a forward bias to the MOST thereby to turn on the MOST and when the circuit is at the activation, the MOST is held at the forward bias or brought to the reverse bias state according to the input of the circuit thereby to turn off the MOST. Here, applying the voltage to the gate of the MOST (M) in such a manner that the reverse bias is applied between the gate and source of the MOST (M) means that when the MOST (M) is of a p-channel type, a voltage higher than that for its p-type source is applied to the gate thereof, and means that when the MOST (M) is of an n-channel type, a voltage lower than that for its n-type source is applied to the gate thereof. The present invention relates to the circuit using such a reverse bias. Incidentally, assume that in the interest of simplicity in the following description, $V_T$ of the MOST is low like 0V, for example, and low and high $V_T$ are respectively 0V and 0.3V even at other MOSTs.

Figure 4A:
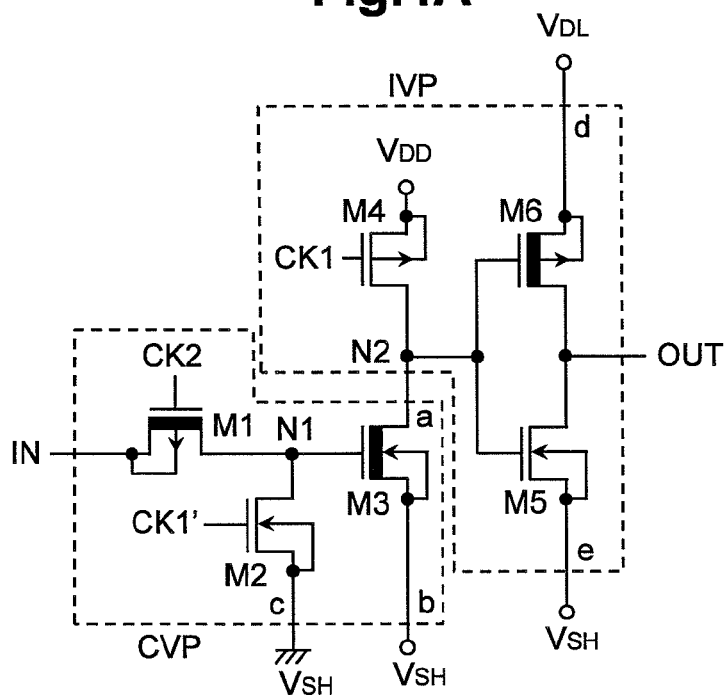
FIG. 4A is a circuit diagram showing a small amplitude input/output CMOS dynamic circuit and its input circuit as an example in which the present invention is applied to a driver.
Figure 4B:
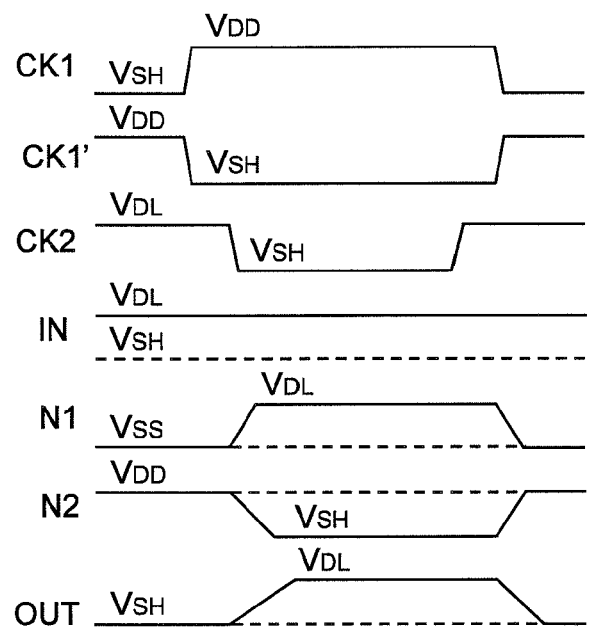
FIG. 4B is an operation timing chart of the circuits shown in FIG. 4A.

An example applied to a driver is shown in FIGS. 4A and 4B. Incidentally, while the following embodiment will explain where internal source voltages $V_{DL}$ and $V_{SH}$ are used, no problem occurs even though the voltages are changed if the relationship between the magnitudes of the voltages is satisfied. Concrete circuits of the converter CVP shown in each of FIGS. 2A and 2B and an inverter IVP that configures an output stage are shown in the figure. They are coupled in series. The transistor M lying within each of FIGS. 2A and 2B corresponds to M6 or M3. M6 and M5 configure an inverter and drive a load with small amplitude (corresponding to the difference between $V_{DL}$ and $V_{SH}$). The switch SW1 corresponds to M4 or M2. The converter CVP comprises a pMOST (M1) of an input unit, which assumes the role of a switch for capturing an input IN signal having low amplitude and assumes the role of discriminating the magnitude of the signal, an nMOST (M3) that receives an output thereof therein, and a switch nMOST (M2) for precharging an output unit of the nMOST (M3) to $V_{SS}$ (0V). Here, $V_T$ of M1 and M3 are respectively brought to small values in such a manner that a small signal input can be detected at high speed. In order to cut off M3 upon non-selection even at low $V_T$, $V_{SH}$ is applied to its source as shown in FIG. 4B. Thus, a node N2 is maintained at a precharge voltage $V_{DD}$. Here, circuit operations will be explained below under the assumption of, for example, $V_{DD}$=0.9V, $V_{DL}$=0.6V, $V_{SH}$=0.3V, $V_{SS}$=0, low $V_T$=0V and high $V_T$=0.3V.

No leakage current flows upon the deactivation, i.e., during the period in which CK2 is $V_{DL}$, if the input IN voltage is $V_{SH}$. This is because a reverse bias of 0.3V is added to a gate-to-source voltage ($V_{GS}$) at $V_T$ (M1)=0V. Since $V_{GS}$=0V if the input voltage is $V_{DL}$, a slight leakage current flows through $V_{SS}$ (0V) of M2. Since, however, M2 is turned on, the node N1 is maintained approximately at $V_{SS}$. Here, the node N2 is precharged to $V_{DD}$ and the output OUT is discharged to $V_{SH}$ by M5. Since $V_{DD}$ is of a high voltage, the corresponding MOST is sufficiently turned on even though $V_T$ of M5 is large. When CK2 is brought to $V_{SH}$ to reach an input signal detecting period upon activation, $V_{GS}$=0V if the input is $V_{SH}$ (0.3V). Therefore, a slight leakage current flows and attempts to charge the node N1 to $V_{SH}$ gradually. The node N1 may however be assumed to be maintained at a substantially constant $V_{SS}$ (0V) in a practical range in which a clock width is a nanosecond. Thus, M3 remains cut-off. If, however, the input is $V_{DL}$ (0.6V), then $V_{GS}$ of Mi goes to $V_{DL}$-$V_{SH}$ (=0.3V) to turn on it, so that the gate of M3 is charged to $V_{DL}$. Thus, M3 is forward-biased by 0.3V to be turned on, and the node N2 is discharged and brought to $V_{SH}$. Consequently, since M6 is forward-biased like $V_{GS}$=$V_{DL}$-$V_{SH}$=0.3V, the load capacitance of the output is charged from $V_{SH}$ taken up to now to $V_{DL}$ at high speed.

Figure 5:
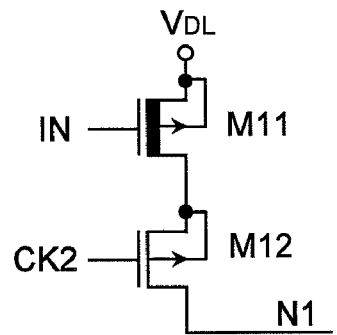
FIG. 5 is a circuit diagram illustrating a circuit available instead of an input transistor M1 shown in FIG. 4A.
Figure 6A:
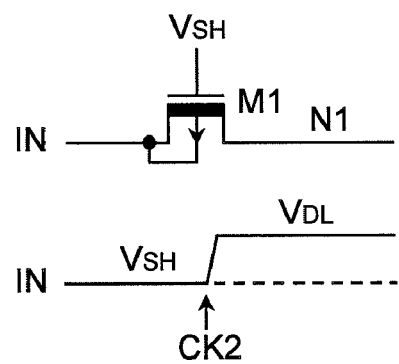
FIG. 6A is a circuit diagram illustrating another circuit available instead of the input transistor Ml shown in FIG. 4A and its timing chart.
Figure 6B:
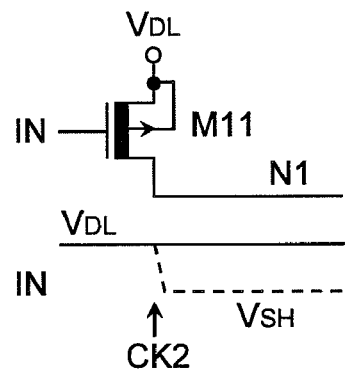
FIG. 6B is a circuit diagram illustrating a circuit available instead of the input transistor M1 shown in FIG. 4A and its timing chart.

In the embodiment shown in FIGS. 4A and 4B, power consumption is reduced in the following manner. The parasitic capacitances $C_{N1}$ and $C_{N2}$ of the nodes N1 and N2, and the load capacitance $C_L$ (not shown in the figure) of the output OUT are driven by their corresponding amplitudes 0.6V, 0.6V and 0.3V. Normally since $C_L$ is sufficiently large and $C_{N1}$ and $C_{N2}$ are sufficiently small, the entire power consumption is determined substantially by charge/discharge power of the load capacitance $C_L$. In conventional FIG. 29, $C_L$ is driven with an amplitude of 0.6V, whereas in the present embodiment, $C_L$ is driven with an amplitude equal to half the amplitude of 0.6V, so that the power consumption is reduced to ¼. Incidentally, an increase in power consumed by causing each of the clocks CK1, CK1' and CK2 to drive each MOST is so small that it may be ignored. This is because since the voltage amplitudes of these clocks are 0.6V or 0.3V and it is enough for related MOSTs to simply drive their corresponding nodes each having a small parasitic capacitance, their gate capacitances are small. If $V_T$ of M2 and M4 are reduced to 0V, then the required clock width can be set even to 0.3V and power related to each clock can be further reduced. Incidentally, a circuit shown in FIG. 5 can also be used instead of the input transistor M1. M11 is a pMOST for detecting an input signal and M12 is a MOST for strobing the input signal. If M12 is turned on by CK2 after the input has been determined, then the circuit becomes the same function as that of the input unit of CVP shown in FIG. 4A. Since no clocks are required where the input is always fixed to $V_{SH}$ upon deactivation, this function can be realized easier. This is because if a dc voltage of $V_{SH}$ is applied to the gate of M1 as shown in FIG. 6A, binary voltages determined with the timing provided to turn off M1 upon deactivation and turn on CK2 upon activation are inputted to M1. The example of FIG. 5 becomes simple as shown in FIG. 6B.

Figure 7A:
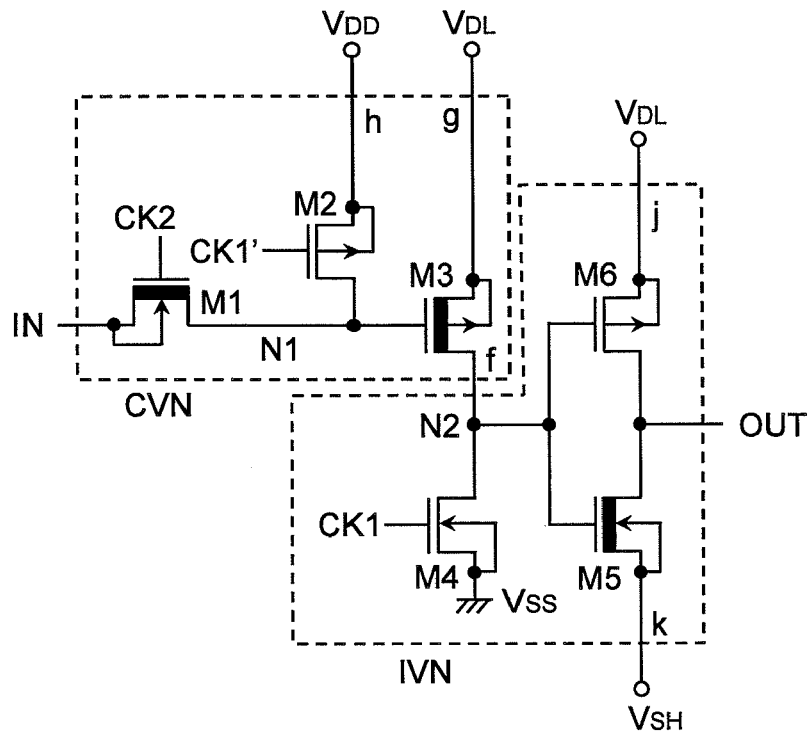
FIG. 7A is a circuit diagram showing another example in which the present invention is applied to a driver.
Figure 7B:
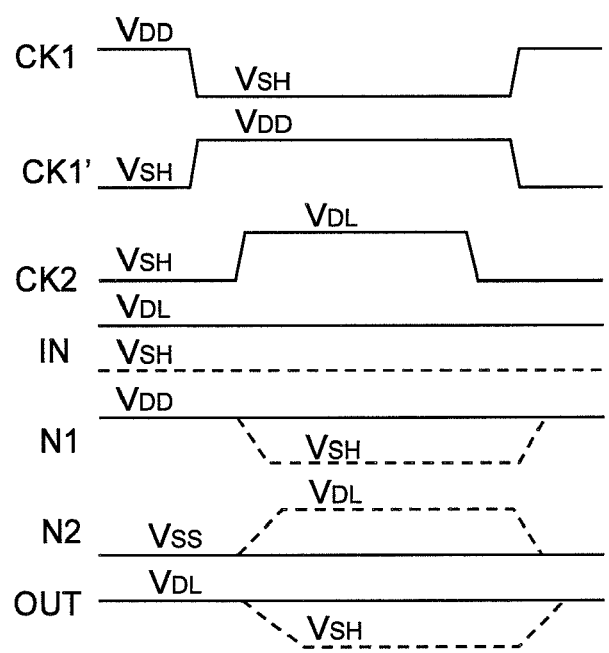
FIG. 7B is an operation timing chart of the circuit shown in FIG. 7A.
Figure 8:
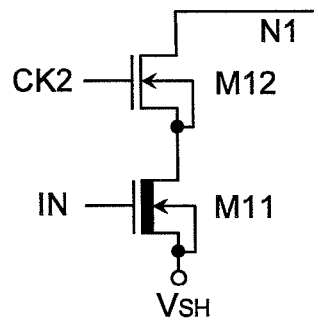
FIG. 8 is a circuit diagram illustrating a circuit available instead of an input transistor M1 shown in FIG. 7A.
Figure 9A:
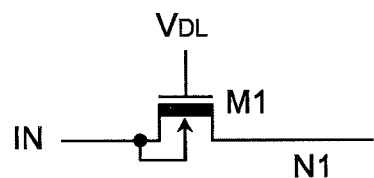
FIG. 9A is a circuit diagram illustrating another circuit available instead of the input transistor M1 shown in FIG. 7A and an operation timing chart thereof.
Figure 9A:
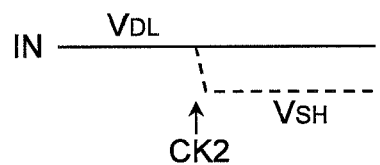
Figure 9B:
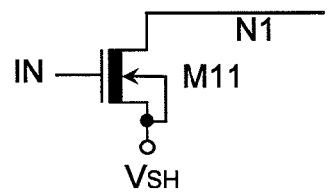
FIG. 9B is a circuit diagram illustrating a further circuit available instead of the input transistor M1 shown in FIG. 7A and an operation timing chart thereof.
Figure 9B:
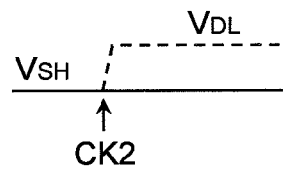

Another example applied to a driver is shown in FIGS. 7A and 7B. This is an example in which the nMOSTs lying within the circuit of FIG. 4A are replaced with pMOSTs and the pMOSTs are replaced with nMOSTs. With their settings, the relationship between voltages becomes opposite to FIG. 4A. For example, upon deactivation, nodes N1 and N2 are respectively precharged to $V_{DD}$ and $V_{SS}$, and an output OUT becomes $V_{DL}$. Since M3 and M5 low in $V_T$ (0V) are reverse-biased to 0.3V, they are cut off. Since a gate-to-source voltage is $V_{DL}$ (0.6V) even at a high $V_T$ (0.3V), M6 is turned on, so that the load becomes $V_{DL}$. FIG. 8, FIG. 9A and FIG. 9B respectively show examples corresponding to FIG. 5, FIG. 6A and FIG. 6B with respect to FIGS. 7A and 7B.

Figure 10A:
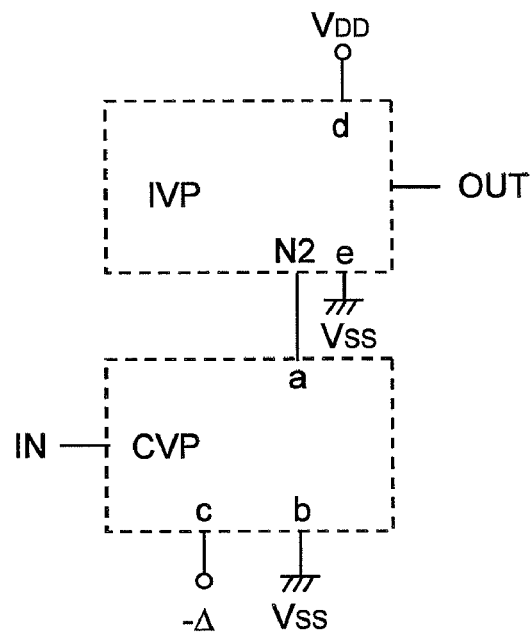
FIG. 10A is a circuit diagram illustrating a CMOS dynamic circuit for converting a small amplitude voltage operation to a large amplitude operation voltage, which corresponds to FIG. 4A.
Figure 10B:
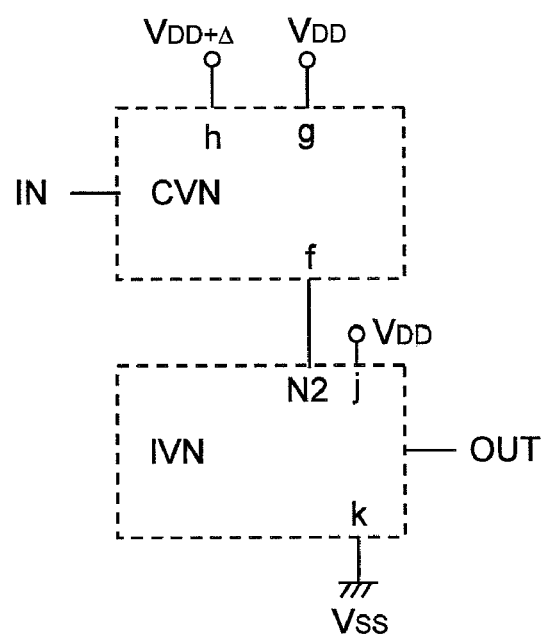
FIG. 10B is a circuit diagram illustrating a large output amplitude circuit corresponding to FIG. 7A.

While each of the embodiments shown in FIGS. 4A and 4B and FIGS. 7A and 7B shows the embodiment in which the large load is driven by the small amplitude input (0.3V from $V_{DL}$ to $V_{SH}$) to the same small amplitude output, FIG. 10A is a circuit for performing conversion from a small amplitude input (0.3V from $V_{DL}$ to $V_{SH}$) to a large amplitude output (0.9V from $V_{DD}$ to $V_{SS}$). Such conversion can be realized by simply changing source voltages and $V_T$ while the circuit format shown in FIGS. 4A and 4B are being maintained. Here, the details of an internal circuit are omitted and circuit blocks are indicated by the terminal names of FIG. 4A. For the large amplitude output, the voltages $V_{SS}$ and $V_{DD}$ are respectively applied to the sources (terminals e and d) of M5 and M6 shown in FIG. 4A. Since, however, the gate and source of M6 become voltages equal to each other upon deactivation thereof, $V_T$ of M6 may still be set large to prevent a leakage current from flowing through M6. Since M5 must be cut off upon activation thereof when the node N2 is discharged and M6 is turned on, the voltage subsequent to the discharge of the node N2 is required to be $V_{SS}$. That is, the voltage to be applied to the terminal b lying in the CVP of FIG. 4A must be changed from $V_{SH}$ to $V_{SS}$. In order to cut M3 in that state upon deactivation thereof, a sufficient negative voltage (-Δ) must be applied to the gate of M3, i.e., the same negative voltage must be applied to its corresponding terminal c. With its application, the voltage on the low level side of the clock CK1' must also be changed to be equal to the negative voltage. FIG. 10B is a large output amplitude circuit corresponding to FIG. 7A. Similarly, M5 lying within FIG. 7A is changed to a large $V_T$ and $V_{DD}$+Δ must further be applied to a terminal h.

Figure 11:
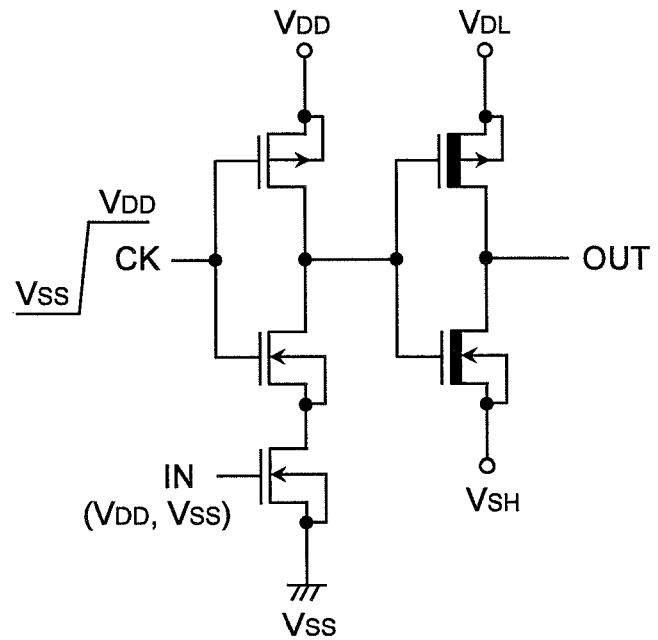
FIG. 11 is a circuit diagram showing a CMOS dynamic circuit for converting a large amplitude voltage operation to a small amplitude voltage operation.

FIG. 11 is a circuit for performing conversion from a large amplitude input (0.9V from $V_{DD}$ to $V_{SS}$) to a low amplitude output (0.3V from $V_{DL}$ to $V_{SH}$). Both an nMOST and a pMOST for the output are a low $V_T$. Their gate voltages become either of $V_{DD}$ and $V_{SS}$ according to an input IN, and each output MOST brought to off is always reverse-biased by $V_{DD}$-$V_{DL}$ or $V_{SH}$-$V_{SS}$. Therefore, the leakage current can be neglected. Since each turned-on MOST is a low $V_T$, the load can be driven with low amplitude at high speed.

Figure 12:
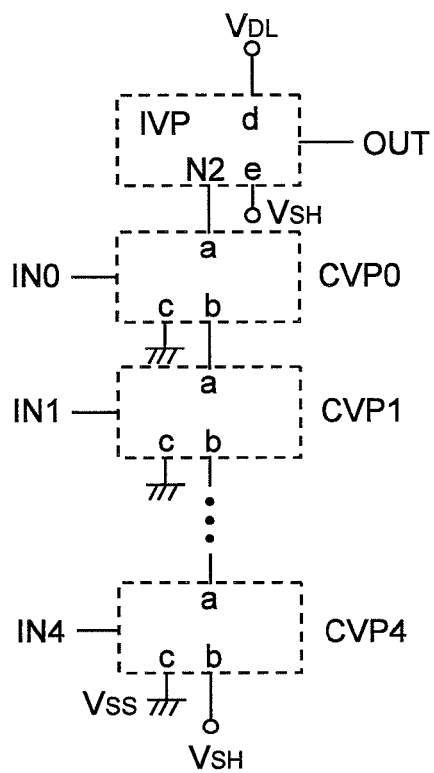
FIG. 12 is a circuit diagram showing an example applied to a NAND circuit.
Figure 13:
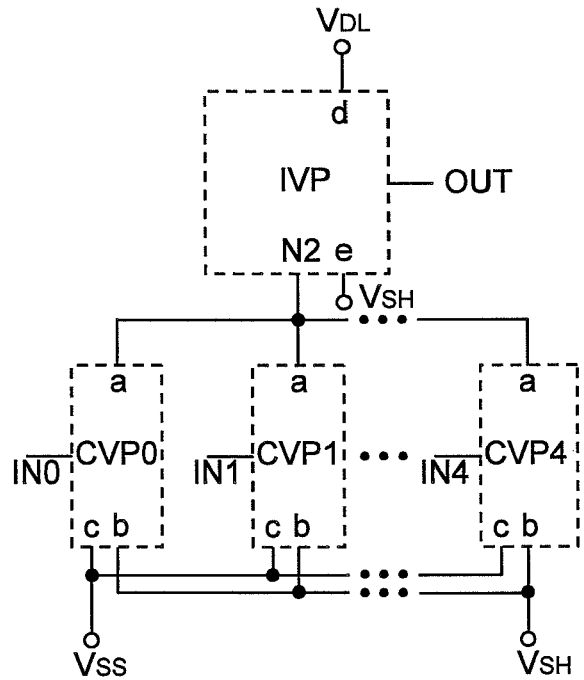
FIG. 13 is a circuit diagram showing an example applied to a NOR circuit.
Figure 14:
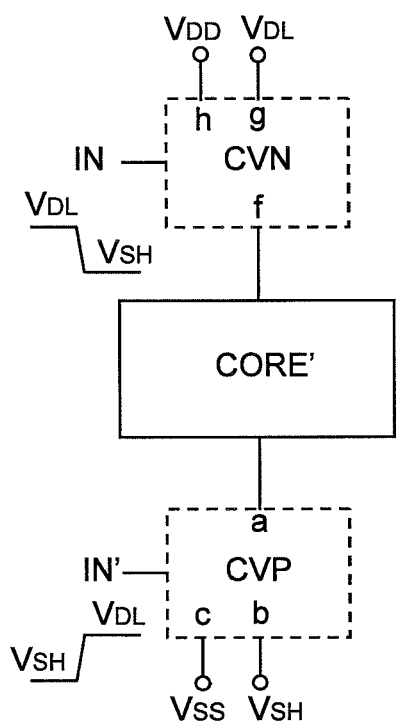
FIG. 14 is a circuit diagram showing an example applied to a power switch.

Each of FIGS. 12 through 14 is an applied example of each embodiment described up to now. FIG. 12 is an application to a NAND circuit. CVP shown in FIG. 4A is vertically stacked in the form of five stages and IVP is coupled in common to the top of the stages. Since the NAND circuit is heavily used on one chip as an address decoder for a memory, and an address input wiring corresponding to the input of the NAND circuit is long and its capacitance is large, a small amplitude operation is desired. Since all address inputs are fixed to a low voltage level ($V_{SH}$ for example) when the decoder is at deactivation, its input unit can be simplified as shown in FIGS. 6A and 6B. When any of plural address inputs (five inputs from IN0 to IN4) is brought to a high voltage level ($V_{DL}$) and its decoder is selected, a node N2 brought to $V_{DD}$ up to now is discharged to $V_{SH}$ and a decoder output OUT brought to $V_{SH}$ becomes $V_{DL}$. If even one input of a low voltage level exists in the plural address inputs, then an output OUT of such a non-selected decoder remains at $V_{SH}$. FIG. 13 is an example applied to a NOR circuit. An IVP is series-coupled in common to five CVPs coupled in parallel. When at least one input is brought to the high level ($V_{DL}$) upon activation, the output OUT brought to $V_{SH}$ up to now changes to $V_{DL}$.

FIG. 14 is an example applied to a power switch. CVN and CVP are coupled to a common source unit of a large scale circuit CORE' operated with small amplitude. The power switch is used to turn off the power supply of CORE' upon at least deactivation or standby for the purpose of cutting a large leakage current developed in CORE'. An extremely large MOST is used for a power switch MOST (corresponding to M3 lying within CVP or CVN in each of FIGS. 4A and 7A) to process large current at the activation of CORE', and its gate capacitance becomes large. It is thus desired that since power for driving such a MOST increases normally, its gate is driven by a small amplitude signal. FIG. 14 is a circuit used therefor. Upon activation, $V_{SH}$ and $V_{DL}$ are respectively applied to inputs IN and IN' to turn on CVN and CVP. $V_{DL}$ and $V_{SH}$ appear at terminals f and a and these become source voltages for CORE'. When $V_{DL}$ and $V_{SH}$ are respectively applied to the inputs IN and IN' where it is desired to deactivate CORE' (turn off the power), CVN and CVP are turned off so that they are separated from CORE', whereby no source voltages are supplied to CORE'.

Figure 15A:
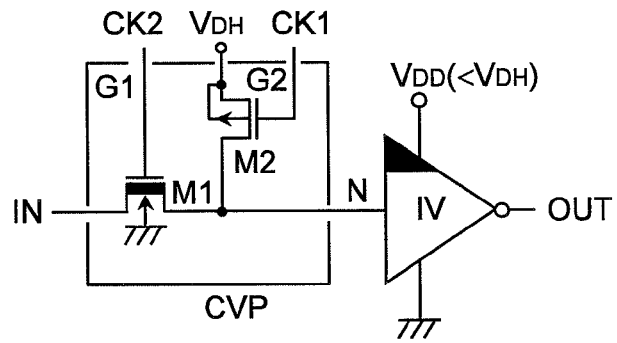
FIG. 15A is a circuit diagram showing a small amplitude output CMOS dynamic circuit and its input circuit as an example in which the present invention is applied to an inverter.
Figure 15B:
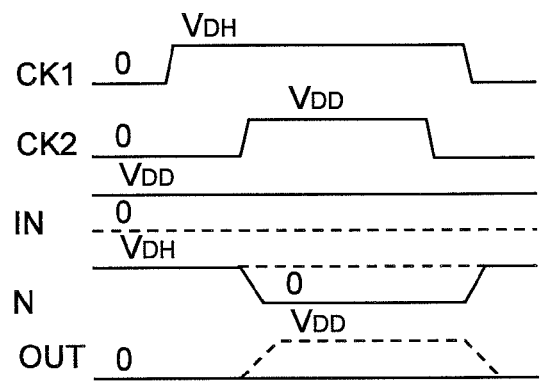
FIG. 15B is an operation timing chart of the circuits shown in FIG. 15A.

FIG. 15 is an applied example of FIG. 2A and is an inverter in which both input/output amplitudes are $V_{DD}$. Incidentally, while the following embodiment will be explained using a step-up source or power supply $V_{DH}$ and a negative voltage $V_{SL}$, the voltages can be changed if the relationship between the magnitudes of the voltages is satisfied. The entire circuit configures one inverter. A concrete example illustrative of the detector DTC, switch SW1 and output circuit in FIG. 2A is shown. DTC corresponds to an nMOST M1, SW1 corresponds to a pMOST M2 and M corresponds to a pMOST Mp lying within a sub inverter IV. Incidentally, although FIG. 4A has described that the switch SW1 in FIG. 2A has been contained in the inverter IVP, the following description will be made with the switch being contained in CVP. This difference is however a difference on description. No particular difference occurs in terms of the essence of the invention about whether the switch SW1 is contained in either IVP or CVP. In the following embodiment, a precharge MOST having a function similar to that of each of the precharge MOSTM2 and M4 shown in FIG. 4A will be explained as M2. $V_T$ of M1 is set to a small value (0V) to discriminate a possible low $V_{DD}$ input at high speed. Further, $V_T$ of M2 is set to a large value like 0.3V to suppress a leakage current at its own off. Since M2 is operated at a large voltage $V_{DH}$, it is allowed. Further, $V_T$ of Mp is selected to be 0V. Thus, $V_{DD}$=0.3V and $V_{DH}$=0.6V as apparent from FIG. 3. With a random input taken as an example, its operation will be explained below. Since CK2 and CK1 are both 0V, M1 is off and M2 is on as shown in FIG. 15B when the inverter is at deactivation, a node N is maintained at $V_{DH}$. Thus, a high-$V_T$ nMOST Mn in the sub inverter IV is turned on so that the output is brought to 0V. Since a reverse bias corresponding to only $V_{DH}$−$V_{DD}$(=0.3V) is applied to Mp of a low $V_T$ in the sub inverter IV during this period, its leakage current can be ignored. During this period, no leakage current flows through M1 if an input IN voltage is $V_{DD}$. This is because $V_T$ is 0V and the reverse bias of 0.3V is added to a gate-to-source voltage ($V_{GS}$). Since $V_{GS}$=0V when the input voltage is 0V, a slight leakage current flows from a $V_{DH}$ terminal of M2 to an input IN. Even though this current shows no problem in the case of M1 having $V_T$=0V or so, the current shows a problem where $V_T$ is further reduced and a low $V_{DD}$ operation is further performed. As will be described later, this problem can of course be solved if the input IN placed during a deactivation period is always fixed to $V_{DD}$ without at random.

Immediately before the activation of the circuit, CK1 is brought to $V_{DH}$ so that M1 is turned off, and the node N is brought to a floating state. Thereafter, when CK2 is brought to $V_{DD}$ and an activation period for detecting an input signal is reached, the gate-to-source voltage $V_{GS}$ of M1 becomes 0V if the input is $V_{DD}$. Therefore, a light leakage current flows through M1 and will gradually discharge the node N placed in the floating state up to now. The node N is however assumed to be maintained at a substantially constant $V_{DH}$ (0.6V) in a practical range in which a pulse width of CK2 for capturing the input is a nanosecond. Thus, Mp lying in the sub inverter IV remains cut-off. If, however, the input is 0V, then $V_{GS}$ of M1 goes to $V_{DD}$−$V_T$(=0.3V) to turn on it, so that the node N is discharged to 0V. Thus, Mp is forward-biased by $V_{DD}$ (0.3V) to be turned on, so that the output OUT is charged to $V_{DD}$. Since $V_T$ of MOST Mn lying in the sub inverter IV is large at this time, no leakage current flows even when its drain voltage is $V_{DD}$. In order to provide a deactivation state subsequently, CK2 is brought to 0V to turn off M1 and then CK1 is brought to 0V to turn on M2 for the purpose of preventing a ratio current to flow between M1 and M2. Consequently, the node N is restored to $V_{DH}$. In the embodiment shown in FIG. 15A, power consumption is reduced in the following manner. A parasitic capacitance $C_N$ of the node N and a load capacitance $C_L$ (not shown in the figure) of the output OUT are respectively driven at 0.6V and 0.3V. Since $C_L$ is normally sufficiently larger than $C_N$, the overall power consumption is determined according to substantially charge/discharge power of $C_L$. Under the same effective gate voltage as 0.3V, $C_L$ is driven with an amplitude of 0.6V in the conventional circuit (refer to FIG. 17), and $C_L$ is driven with an amplitude equal to half the amplitude of 0.6V in the present embodiment. Therefore, the power consumption is reduced approximately to ¼. Incidentally, although CK1 and CK2 are extra clocks than conventional, an increase in power consumption by these is so small that it may be ignored. This is because the load capacitance due to these is smaller than $C_L$ and if a slight leakage current is allowed as will be mentioned later, then the voltage amplitude of each related clock can be reduced like 0.3V. Although the above embodiment has been done assuming that for simplicity of description, $V_T$ large uniformly with respect to all MOSTs is 0.3V and $V_T$ low uniformly therewith is 0V, they can be suitably changed according to the spec of the leakage current and the need for the discharge velocity of the node N. As to the spec of the leakage current, for example, the circuit must generally suppress the leakage current at its deactivation (period in which CK1 and CK2 are both 0V)

severer. Attention should therefore be given to MOSTs (Mp, M2 and M1) through which the leakage current is likely to flow during this period. It is also necessary to pay attention even to $V_T$ of MI in terms of the discharge velocity of the node.

Assuming that $V_T$ of M1 and M2, and $V_T$ of Mp and Mn in the sub inverter IV are respectively set to $V_T$ (M1), $V_T$ (M2), $V_T$ (Mp) and $V_T$ (Mn), and the effective gate voltage necessary at the turning on of each MOST is 0.3V, the following equations are established at the respective MOSTs.

<<1>> Mp: $V_{DH} \geq \{V_{DD} + V_T (Mp)\} + 0.3V$ from the equations (1) and (2) to cut off it at a gate voltage of $V_{DH}$, and $V_{DD} + V_T (Mp) \geq 0.3V$ therefrom to turn on it at a gate voltage of 0V. Under these conditions, the value of $V_T$ (Mp) can be changed arbitrarily and $V_{DD}$ and $V_{DH}$ can also be changed according to it. As described above, FIG. 3 is the example of $V_{DD} + V_T (Mp) = 0.3V$.

<<2>> Mn: $V_T (Mn) \geq 0.3V$ to cut off it at a gate voltage of 0V without the leakage current, and $V_{DH} - V_T (Mn) \geq 0.3V$ to turn on it at a gate voltage of $V_{DH}$. Thus, these conditions are established if $V_{DH} \geq 0.6V$. Of course, $V_T (Mn)$ can be reduced to 0V or so if a slight leakage current is allowed at off.

Figure 15C:
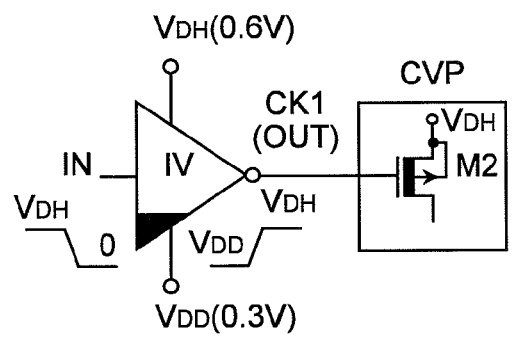
FIG. 15C is a circuit example for driving the gate of a precharge pMOST M2 shown in FIG. 15A.

<<3>> M2: $V_T (M2) \leq -0.3V$ to cut off it at a gate voltage of $V_{DH}$ without the leakage current, and $V_{DH} + V_T (M2)$ 0.3V to turn on it at a gate voltage of 0V. Thus, these conditions are established if $V_{DH} \geq 0.6V$. Since $V_T (M2)$ can of course be reduced to 0V or so if a slight leakage current is allowed at off, the design thereof becomes easy. This is because since the amplitude of CK1 can be reduced to $V_{DH} - V_{DD}$ (=0.3V), the charge/discharge power of a load for a CK1 generating circuit can be lowered. Since CK1 is $V_{DD}$ (0.3V) upon deactivation of the circuit (at the turning on of M2) in this case, the gate-to-source voltage becomes $V_{GS} = V_{DH} - V_{DD} = 0.3V$ so that M2 is turned on. Further, since CK1 is $V_{DH}$ (0.6V) upon activation of the circuit (at the turning off of M2), the gate-to-source voltage becomes $V_{GS} = 0$ so that M2 is brought approximately to off. FIG. 15C is one example of such a CK1 generating circuit. An input pulse having an amplitude $V_{DH}$ is converted to a desired CK1 pulse without the leakage current by a sub inverter IV in which MOSTs having low and high $V_T$ are combined together.

<<4>> Since $V_T (M1)$ of M1 is related to the effective gate voltage of M1 as shown below, it is closely related to $V_{DD}$. While CK2 is brought to $V_{DD}$ to activate M1, the current In ($V_{DD}$) where the input is $V_{DD}$ is small because its gate-to-source voltage becomes 0V, whereas the current In (0) where the input is 0V is large because its gate-to-source voltage becomes $V_{DD}$. Although even a current of 0 or more is allowed if the difference between the currents In ($V_{DD}$) and In (0) is greater than or equal to a given value, i.e., it is allowed even when M1 is a certain degree of depletion type, assume that In ($V_{DD}$)=0, i.e., $V_T (M1) \geq 0V$ in an enhancement type for simplicity herein. In doing so, the node N is maintained at $V_{DH}$ given up to now if the input is $V_{DD}$. On the other hand, if the input is 0V, then the node N begins to discharge from the $V_{DD}$ level. It is assumed that the discharge of the node to $V_{DD} + V_T (Mp)$ is allowed. This is because when the node is discharged to this point, a critical point at which the logical state placed up to now, of the sub inverter IV changes is reached. This is also because at least MP will begin to turn on, and on the other hand, when $V_{DD} + V_T (Mp)$ is larger than $V_T$ (Mn), Mn will begin to turn off. The relationship between a required $V_T (M1)$ and $V_{DD}$ is determined in the following manner under the effective gate voltage $V_{DD}$ of Mp+$V_T$ (Mp)= 3V and $V_{DH}$=0.6V. Assume that the pulse width of CK2 is $t_W$, the capacitance of the node N is CN, the channel width of M1 is W, and the channel length thereof is L. When the critical point is reached after $t_W$ from the application of CK2, M1 is operated in a saturated state during this period and hence the following equations are established:

In (0)=$C_N(V_{DH}-V_{DD})/t_W$=0.3×$C_N/t_W$

In (0)=$\beta/2\{V_{DD}-V_T(M1)\}^2$, $\beta = W/L\beta_0$ $\therefore \{V_{DD}-V_T(M1)\}^2 = 0.6 C_N/\beta t_W$    (6)

Since the right side of the equation (6) is a constant, the more $V_T(M1)$ is decreased, the more $V_{DD}$ can also be reduced. In a 65 nm device technology, for example, $V_{DD}$=0.12V where W/L=140 nm/50 nm, $\beta_0$=0.43 μS/V, $C_N$=1.8 fF and $t_W$=2.5 ns if $V_T$ (M1)=0V. Thus, M1 discriminates the input at $V_{DD}$ greater than the above. When Mp is operated with $V_{DD}$ as a source voltage, $V_T$(Mp)=0.18V is reached from the condition of $V_{DD}+V_T$ (Mp)=0.3V. Therefore, Mp must be a depletion type. When this $V_{DD}$ is taken, power consumption is brought to about 1/25 as compared with the conventional 0.6V -operated circuit (FIG. 17).

Figure 16:
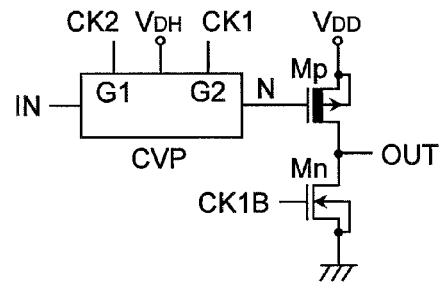
FIG. 16 is a circuit diagram illustrating a further speeded-up circuit of FIG. 15A.

FIG. 16 is an example in which the nMOST lying within the sub inverter IV of FIG. 15A is separated and added to the output. While CK1B corresponding to an inverted signal of CK1 is newly required to precharge the output to 0V, the corresponding circuit is operated faster. This is because the capacitance of the node N is lightened by the absence of the gate capacitance of Mn. Incidentally, since $V_T$ of Mn is selected widely, CK1B becomes a high-amplitude pulse changed from 0V to $V_{DH}$. If $V_T$ of Mn is however reduced to 0V or a depletion type is taken, then CK1 must be maintained at a high-amplitude $V_{DH}$ pulse but CK1B can be brought to a low-amplitude $V_{DD}$ pulse. This is because since the output OUT is 0V, thus the source and drain of Mn become a potential equal to 0V upon deactivation, no leakage current flows even at such $V_T$. Although a slight leakage current however flows so long as the output OUT reaches $V_{DD}$ upon activation, the current is so mall that it may be ignored as compared with another activation current. When the leakage current cannot be still ignored, the gate and source of Mn may be controlled according to upon its activation and deactivation as will be described later.

Figure 17A:
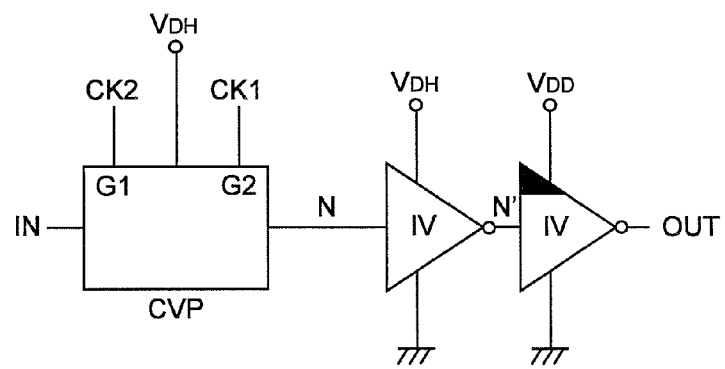
FIG. 17A is a circuit diagram showing another example in which the present invention is applied to a driver.
Figure 17B:
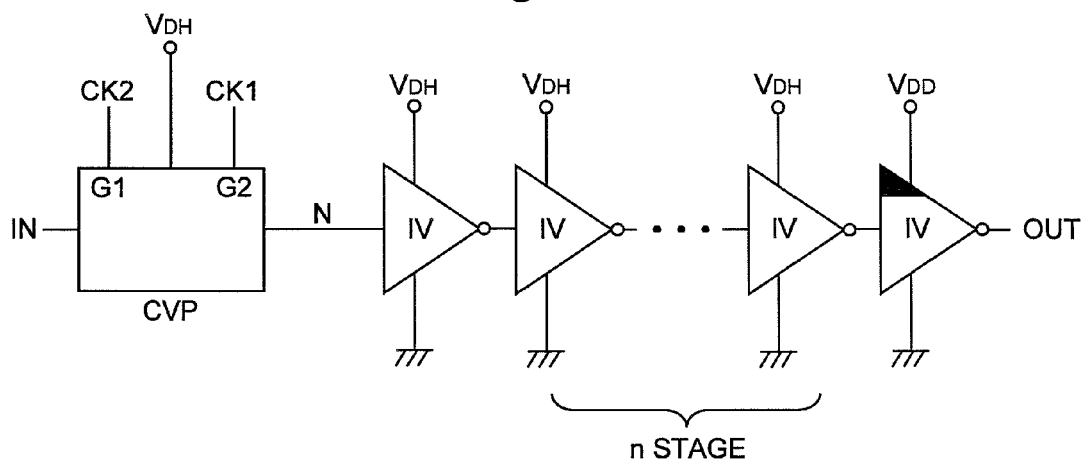
FIG. 17B is a circuit diagram showing a further example comprised of multi-stage inverters, in which the present invention is applied to a driver.

FIG. 17 is an inverter or driver in which both input/output amplitudes are $V_{DD}$. While this makes use of the voltage converter CVP shown in FIG. 15A, a circuit from an input IN to N' can be assumed to be the detector DTC and switch SW2 of the input shown in FIG. 2A. Unlike FIG. 15A and FIG. 16, however, FIG. 17 is an example in which a low-$V_T$ pMOST lying within a sub inverter IV operated at $V_{DD}$ upon deactivation of the circuit, and a reverse bias is applied between the gate and source thereof upon its activation. That is, while the output OUT becomes $V_{DD}$ since the gate of the pMOST is turned on at 0V upon deactivation, the node N' is maintained at 0V or brought to $V_{DH}$ according to the input IN upon activation. If it is brought to $V_{DH}$, then the output OUT is discharged to 0V but no leakage current flows through pMOST at this time. This is because the gate of the pMOST is reverse-biased by $V_{DH}-V_{DD}$. In FIG. 17B, multistage (n stages) sub inverters IV which are operated at $V_{DH}$ and capable of ignoring the leakage current, are coupled, and a sub inverter IV operated at $V_{DD}$ is coupled to a final stage. The entire circuit takes the inverter or driver depending on the number of stages. Since a voltage relationship similar to FIG. 17A is established at the final stage and its previous stage, the entire leakage current is so small that it may be ignored. Here, the multistage sub inverters act as buffers. Since the size of each sub inverter can be gradually reduced toward its previous stage even when the load capacitance of the output OUT is large in particular, eventually, the size of the sub inverter coupled directly to the node N can be minimized and its input capacitance, i.e., the capacitance of the node N can be made extremely small. Thus, even M1 and M2 lying in CVP can control the voltage of the node N at high speed.

Figure 18A:
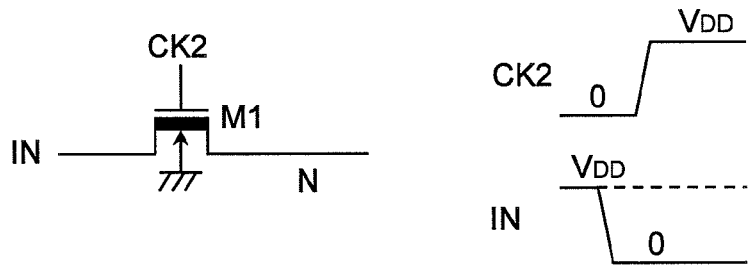
FIG. 18A is a circuit diagram illustrating a circuit available instead of an input transistor M1 shown in FIG. 15A and an operation timing chart thereof.
Figure 18B:
FIG. 18B is a circuit diagram illustrating another circuit available instead of the input transistor M1 shown in FIG. 15A and an operation timing chart thereof.
Figure 18C:
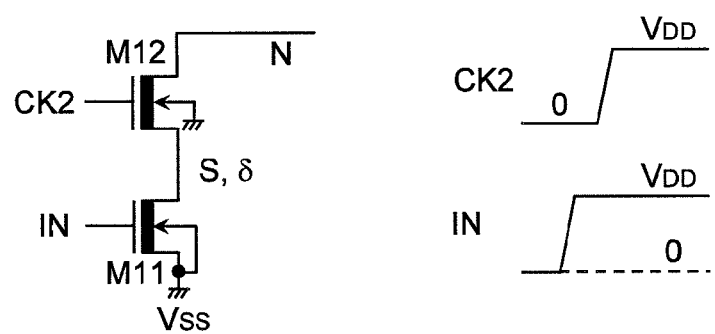
FIG. 18C is a circuit diagram illustrating a further circuit comprised of two MOSTs instead of the input transistor M1 shown in FIG. 15A and an operation timing chart thereof.

FIG. 18 shows another embodiment illustrative of the detector DTC and switch SW2 shown in FIG. 2A. FIG. 18A is a circuit identical to the input transistor M1 of FIG. 15A but different in how to apply the voltage. The input at deactivation thereof is random in FIG. 15A, whereas the input is always fixed to $V_{DD}$ in the present example. Since the gate of an nMOST is 0V and a node N is $V_{DH}$, a reverse bias of only $V_{DD}$ is applied between the gate and source of M1, and its leakage current becomes so small that it may be ignored. If $V_{DD}$ is applied to the gate after the input IN has been determined, then the voltage of the node N is determined upon activation according to the input as mentioned above. Incidentally, if the input is fixed to $V_{DD}$ upon deactivation, then the gate of M1 might not be controlled purposely by its corresponding pulse. This is because M1 is almost off upon deactivation by simply applying a dc voltage of $V_{DD}$ at all times, and M1 is automatically operated according to determined binary input voltages upon activation. Upon the deactivation, however, a slight leakage current flows through M1 since 0V is applied between the gate and source thereof and $V_T$ is 0V. When it is however allowed, its design becomes simple by the absence of the need to control the gate by the corresponding pulse. The same function is obtained even in FIG. 18B in which the gate and source of MOST in FIG. 18A are interchanged. Similarly, if the gate is brought to 0V upon deactivation and the source is brought to $V_{DD}$, then the leakage current at the deactivation can be ignored. Although the slight leakage current flows upon the deactivation if the source is brought to 0V as a matter of course, MOST is operated normally according to the input upon its activation. FIG. 18C is another example of a gate input. Upon the deactivation, the input is fixed to 0V. If M12 is turned on by CK2 having a $V_{DD}$ amplitude after the input has been determined, it becomes the same function as M1 of FIG. 15A. Since M11 and M12 are both low in $V_T$ although being off upon their deactivation, there is a possibility of a slight leakage current flowing therethrough. When, however, MOSTs each placed in the off state are series-coupled two or more as already known, the leakage current becomes small due to vertical stack effects thereof. That is, since M11 is seemed to be certain impedance when the leakage current attempts to flow through both MOSTs, a low or small voltage δ appears at the source S of M12 and a reverse bias is applied between the gate and source thereof by δ, so that the leakage current of M12 becomes small correspondingly. This is eventually because the leakage current flowing through both MOSTs is suppressed by the leakage current of M12 itself, which has been reduced. Incidentally, CK2 and the input IN may be interchanged with each other as needed. Although $V_T$ of M12 has been selected to be low to bring CK2 to the low amplitude of $V_{DD}$ in FIG. 18C, the leakage current at the deactivation becomes so small that it may be ignored independently of the input, where CK2 changed from 0V to $V_{DH}$ can be used. This is because since $V_T$ of M12 can be selected widely, M12 is perfectly cut off at off. Incidentally, FIG. 18 corresponds to FIGS. 5 and 6 referred to above. It is needless to say that the items described in detail in FIG. 18 are applicable even to FIGS. 5 and 6. Needless to say, the items described in FIGS. 5 and 6 are applicable to FIG. 18 in reverse.

Figure 19A:
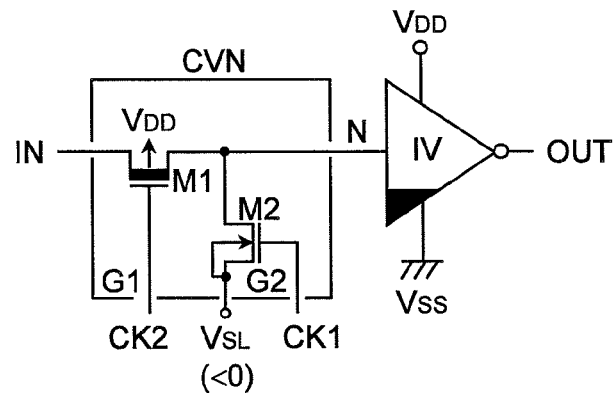
FIG. 19A is a circuit diagram showing a small amplitude output CMOS dynamic circuit using a negative voltage and its input circuit as an example in which the present invention is applied to an inverter.
Figure 19B:
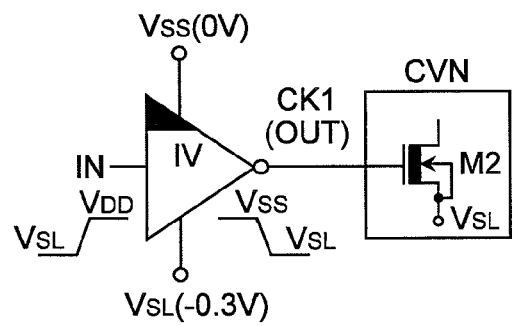
FIG. 19B is a circuit example for driving the gate of a precharge nMOST M2 shown in FIG. 19A.
Figure 19C:
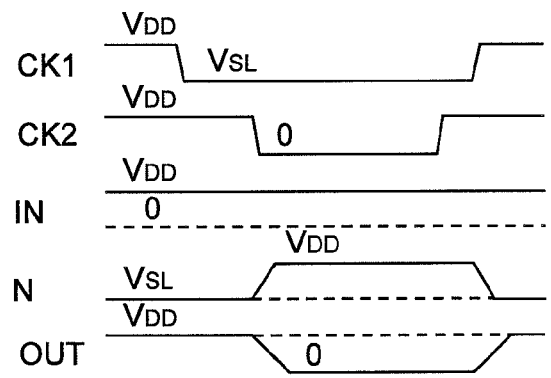
FIG. 19C is an operation timing chart of the circuits shown in FIG. 19A.
Figure 20:
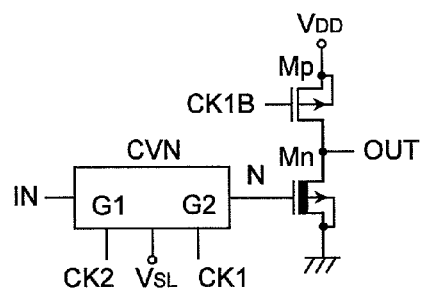
FIG. 20 is a circuit diagram illustrating a further speeded-up circuit of FIG. 19A.
Figure 21A:
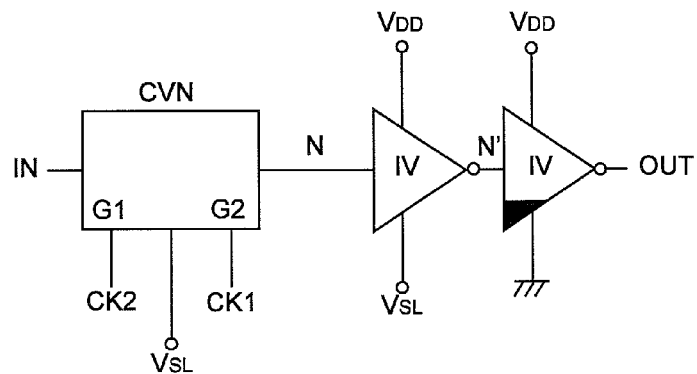
FIG. 21A is a circuit diagram showing another example in which the present invention is applied to a driver.
Figure 21B:
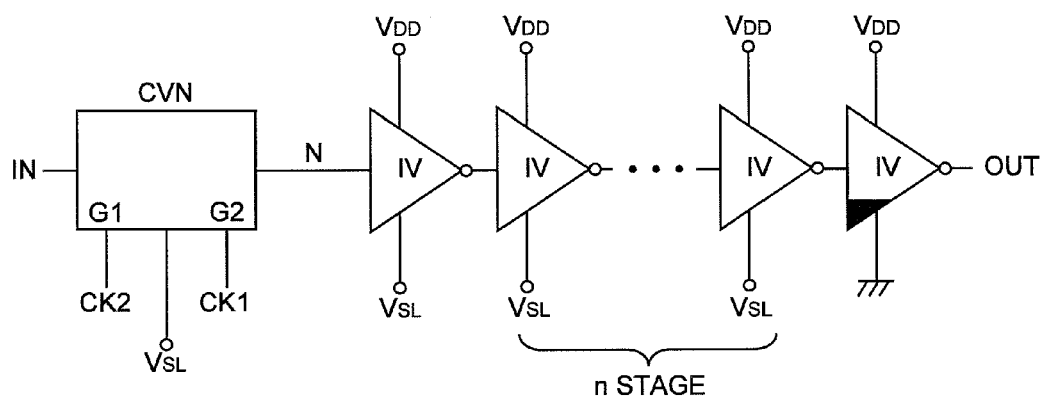
FIG. 21B is a circuit diagram showing a further example comprised of multi-stage inverters, in which the present invention is applied to a driver.
Figure 22A:
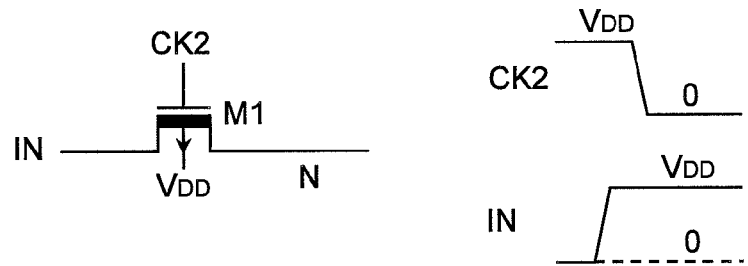
FIG. 22A is a circuit diagram illustrating a circuit available instead of an input transistor M1 shown in FIG. 19A and an operation timing chart thereof.
Figure 22B:
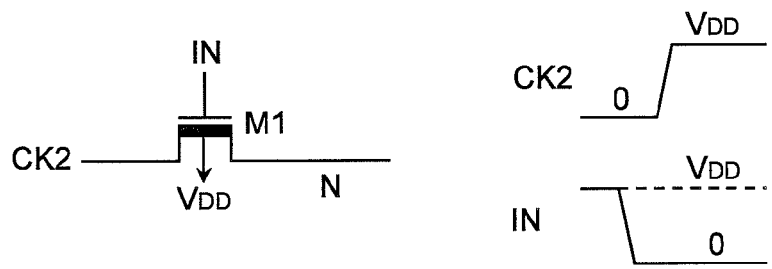
FIG. 22B is a circuit diagram illustrating another circuit available instead of the input transistor Ml shown in FIG. 19A and an operation timing chart thereof.
Figure 22C:
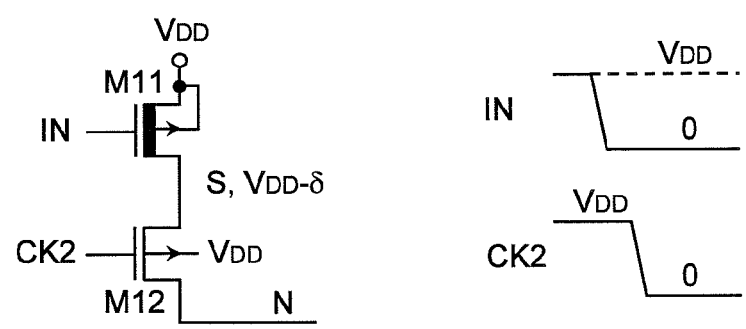
FIG. 22C is a circuit diagram illustrating a further circuit comprised of two MOSTs instead of the input transistor M1 shown in FIG. 19A and an operation timing chart thereof.

FIG. 19 is an example applied to an inverter in which both input/output amplitudes are $V_{DD}$. This is an example in which the nMOST lying in the circuit of FIG. 15A is replaced with a pMOST and the pMOST lying therein is replaced with an nMOST. Although the relationship between voltages becomes opposite to FIG. 15 with their replacement, their operations can also be explained in like manner. Upon deactivation, for example, the node N is precharged to a negative voltage $V_{SL}$, and the nMOST Mn lying in a sub inverter IV is cut off since it is reverse-biased by 0.3V even though its $V_T$ is low like 0V. On the other hand, since the pMOST lying in the sub inverter IV is turned on even if its $V_T$ is large like 0.3V, an output OUT is brought to $V_{DD}$. FIG. 20 corresponds to FIG. 16, FIG. 21 corresponds to FIG. 17, and FIGS. 22A through 22C respectively correspond to FIG. 18A through 18C. Incidentally, CK1B shown in FIG. 9 is an inverted signal of CK1 changed from $V_{SL}$ to $V_{DD}$.

Figure 23A:
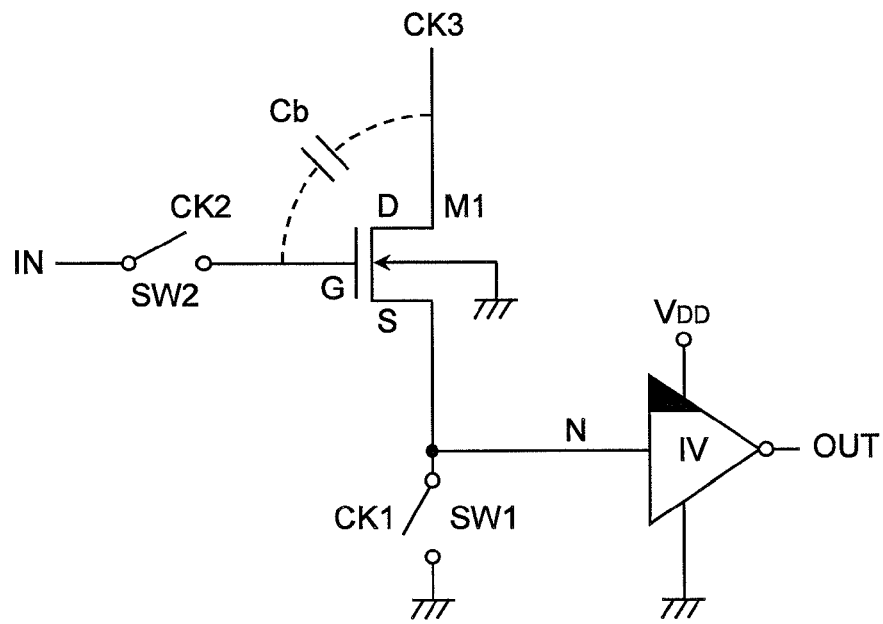
FIG. 23A is a circuit diagram of an inverter in which the present invention is applied to a circuit using a MOS capacitor.
Figure 23B:
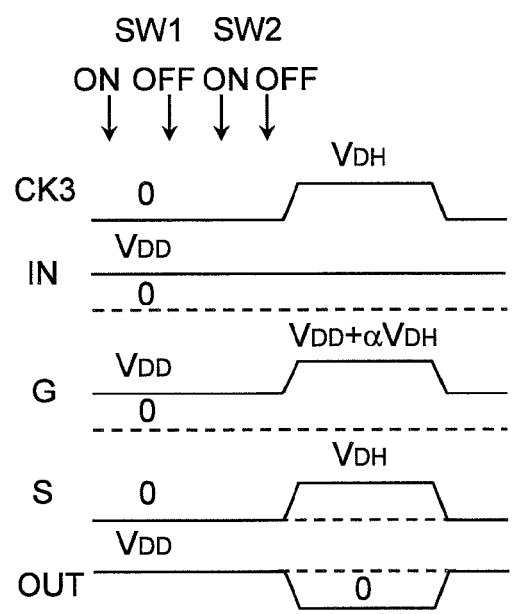
FIG. 23B is an operation timing chart of the circuit shown in FIG. 23A.

If the two sources or power supplies ($V_{DD}$ and $V_{DH}$ or $V_{DD}$ and $V_{SL}$ except for ground $V_{SS}$) are used as described above, then a small number of MOST can configure a low voltage/low power circuit. Various embodiments will further be described below with the use of $V_{DD}$ and $V_{DH}$ taken as an example. FIG. 23 is an embodiment of an inverter in which input/output amplitudes are both $V_{DD}$. This is however different from one used up to now in that the capacitance included in each MOST itself is used. It is well known that if a gate (G) voltage is higher $V_T$ or above than a source (S) voltage or a drain (D) voltage, then a large MOS capacitance Cb determined by the thickness of a gate oxide and a gate area is formed between the drain and gate or between the gate and source. This embodiment is an inverter using the present characteristics. Namely, a switch SW1 is first turned on by a clock CK1 to discharge a node N to 0V. Thereafter, the switch SW1 is turned off. Although a pMOST in a sub inverter IV is turned on so that an output OUT is brought to $V_{DD}$, no subthreshold leakage current flows because an nMOST in the sub inverter IV is large in $V_T$. Thereafter, a switch SW2 is turned on by CK2 to input $V_{DD}$ greater than or equal to $V_T$ corresponding to the input voltage or 0V less than or equal to $V_T$ to the gate of the MOST M1, thereby turning off the switch SW2. Afterwards, a clock CK3 having an amplitude $V_{DH}$ is inputted to the drain thereof. Since the MOS capacitance Cb is large if the gate voltage is $V_{DD}$, the gate voltage $V_G$ is raised and its value reaches $V_G=V_{DD}+\alpha V_{DH}$, $\alpha=Cb/(Cb+Cp)$. Here, Cp is a parasitic capacitance at the gate and a value extremely smaller than Cb. If the value of the raised $V_G$ is selected to be greater than or equal to the sum of $V_{DH}$ and $V_T$, then the amplitude $V_{DH}$ of the clock CK3 appears at the source as it is. Thus, the output OUT is discharged by the nMOST lying in the sub inverter IV at high speed. Since a reverse bias is applied between the gate and source of a low-$V_T$ pMOST in this case, no subthreshold leakage current flows. Thus, this example is an example in which a reverse bias is applied upon activation as shown in FIG. 17A. On the other hand, since Cb is approximately zero if the input is 0V, VG remains approximately 0V and the MOST M1 is cut off so that no voltage appears at the node N. Accordingly, the output OUT remains at $V_{DD}$. Thus, when the MOS capacitance is used, the difference between $V_{DD}$ and 0V at the input IN is amplified to $V_{DH}$ and 0V at the node N. In the present embodiment, the input IN to the node N corresponds to the DTC and switch SW2 of FIG. 2A.

Figure 24A:
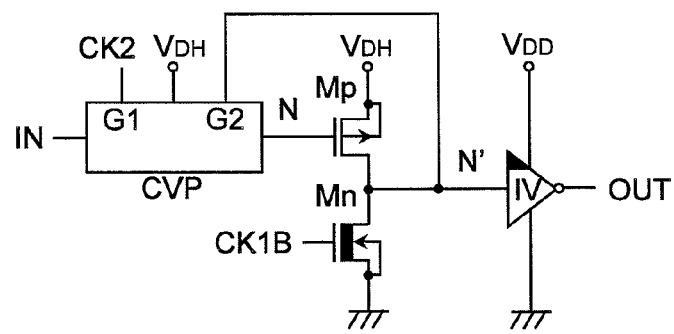
FIG. 24A is a circuit diagram in which the present invention is applied to a converter using a feedback loop.
Figure 24B:
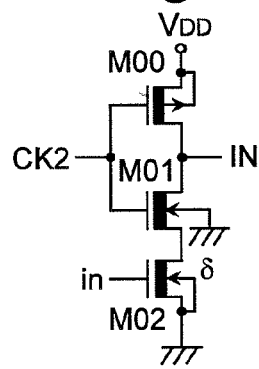
FIG. 24B shows a pre-stage circuit example of FIG. 24A.
Figure 24C:
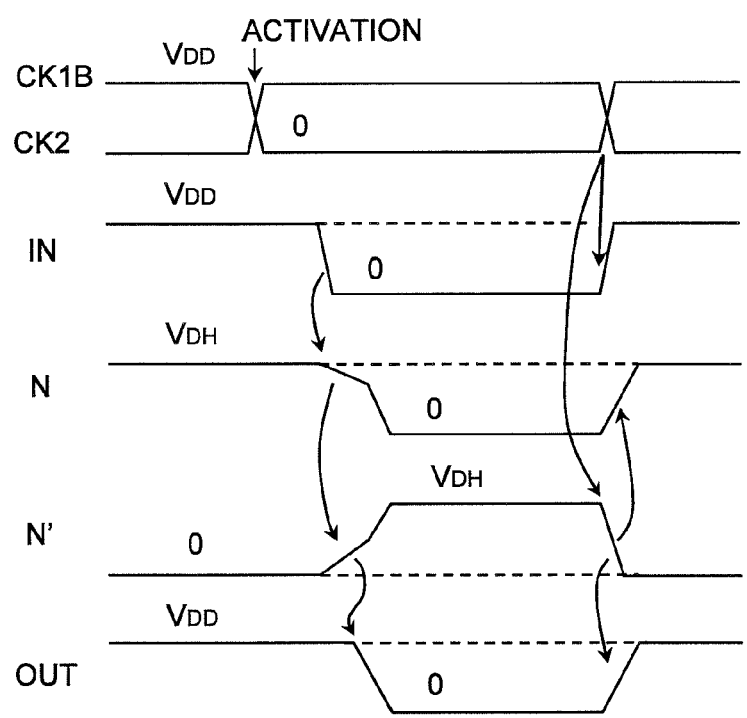
FIG. 24C shows operating timings of FIG. 24A.

FIG. 24A is a system that controls the switch SW1 of FIG. 2A by the voltage of an output OUT. An output (N') voltage of a driver in which the embodiments of FIGS. 16 and 17A have compromised with each other, is fed back to control a pMOST M2 lying in a voltage converter CVP. Here, a low $V_T$ is used for M1 and Mn to bring the amplitudes for CK2 and CK1B to $V_{DD}$ as mentioned above. The operation of the system will be explained below assuming that a circuit shown in FIG. 24B is coupled to a stage prior to the input IN. Since M00 is on and M01 is off upon deactivation (CK2: 0V and CK1B: $V_{DD}$) irrespective of the state of an input in of a pre-stage circuit, the input IN is charged to $V_{DD}$ so that a pMOST M2 lying in CVP with an output N' of 0V as a gate voltage, the node N is discharged to $V_{DH}$. Next, upon circuit's activation, i.e., when the input in of the pre-stage circuit is determined and the clock CK2 is brought to $V_{DD}$ to activate the circuit, the operation differs according to the input state. Since M1 is turned on if the input IN is 0V, the voltage of the node N is reduced slightly from $V_{DH}$. This is because the voltage is determined by the proportion (so-called ratio) between the conductance of M1 and that of M2. In doing so, an output MOST Mp assumes the direction to be turned on and hence the voltage of the output N' slightly rises, so the pMOST M2 assumes the direction to be turned off. Thus, the voltage of the node N is lowered from the first value. With such a feedback, the node N is rapidly discharged to 0V, so that the pMOST Mp is perfectly turned on. Thus, the output (node N') is finally charged to $V_{DH}$ and thereafter the output OUT of a sub inverter IV at its subsequent stage is brought to 0V. Since a reverse bias is applied between the gate and source of the pMOST lying in the sub inverter IV of the subsequent stage in this case, no leakage current flows. In this state, M2 is cut off, thus the gate voltage of M2 becomes $V_{DH}$. Upon the next deactivation, Mn is turned on by CK1B so that the node N' begins to discharge from $V_{DH}$. In doing so, the pMOST M2 lying in CVP begins to turn on thereby to charge the node N. Eventually, the node N, node N' and output OUT are respectively restored to $V_{DH}$, 0V and $V_{DD}$ again at high speed by feedback effects. Incidentally, since the input MOST M1 remains off if the input IN is $V_{DD}$, an internal voltage and an output voltage remain in a deactivated state. The embodiment using this feedback has an advantage in that a pulse having a $V_{DH}$ amplitude for controlling the gate of M2 is not necessary. This is because although the pulse of $V_{DH}$=0.6V must be supplied from outside where $V_{DD}$ is 0.1V or so as mentioned above, for example, the design of the circuit becomes difficult by an increase in the difference between $V_{DD}$ and $V_{DH}$, and the loss of power to be used up or consumed is also large. When it is desired to operate the entire circuit at such a low and equal $V_{DD}$, Mn may be set to a depletion type of $V_T$=0.2V or so. Since the effective gate voltage at on becomes 0.3V even at a clock of $V_{DD}$=0.1V and a drain-to-source voltage thereof is 0V at off, no leakage current flows even where Mn is of the depletion type. In order to bring $V_T$ of Mn to an enhancement type of 0.3V or so and perfectly suppress the leakage current, the gate thereof may be controlled by a clock of 0.6V or so using another source voltage. Incidentally, even though the input pre-stage circuit (FIG. 24B) is comprised of MOSTs low in $V_T$ as described above, the leakage currents of M01 and M02 become small due to the vertical stack effects thereof upon the deactivation. Since the load can be driven at the low voltage $V_{DD}$ even in the present embodiment if the load capacitance of the output OUT is far larger than the node capacitance of the pre-stage, the entire circuit is brought to low power. However, considerable leakage current flows even if Mn is off during a period in which the output is $V_{DH}$. In order to reduce it on the other hand, the gate and source (ground terminal of Mn in FIG. 24A) of Mn may respectively be controlled to be 0V and $V_{DD}$ upon the activation of the circuit (i.e., during a period in which $V_{DH}$ is being outputted) and to be $V_{DD}$ and 0V in reverse upon the deactivation of the circuit (i.e., during a period in which a constant voltage of 0V is being outputted). In this case, however, the substrate or well for Mn must be fixed to 0V corresponding to the even lower voltage as mentioned above. The leakage current of Mn is lowered by the application of the reverse bias of $V_{DD}$ between the gate and source of Mn during the period in which the output is $V_{DH}$. The method for controlling the source and gate in this way upon the activation and deactivation is applicable even to FIG. 25B to be described later and Mn shown in FIG. 16, for example. Even when $V_T$ of Mn in the figure is sufficiently lowered or the depletion type is adopted, a low $V_{DD}$ operation is enabled by less leakage current.

Figure 25A:
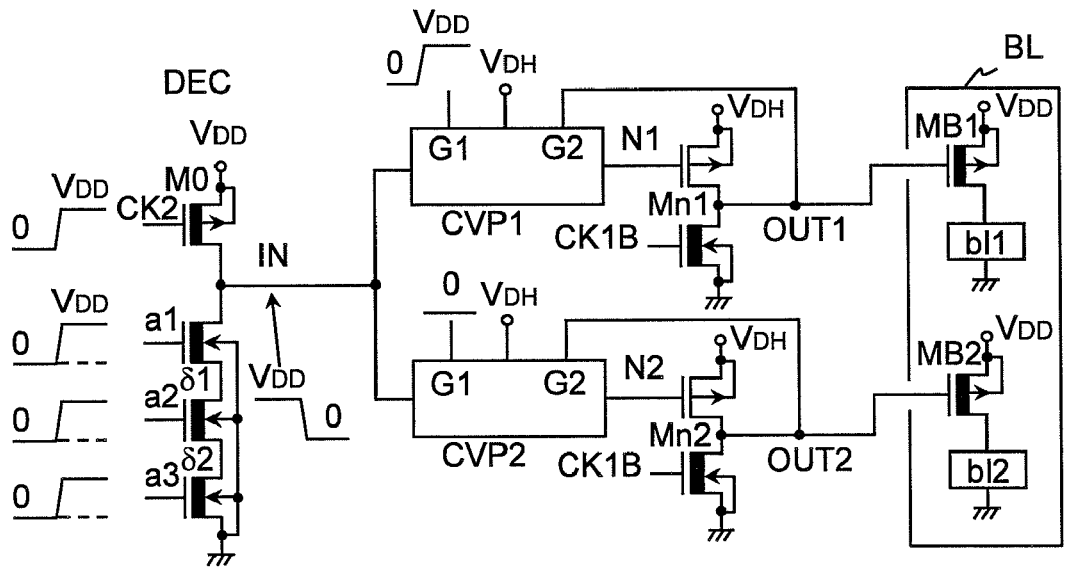
FIG. 25A is an applied example of FIG. 24A for selecting and driving a plurality of blocks.

Several applications each using the feedback system of FIG. 24A will be shown below. Incidentally, the following examples can be applied in like manner even to the examples free of the execution of the feedback, e.g., FIGS. 15A, 16 and 19A or FIG. 20, etc. A circuit shown in FIG. 25 comprises a voltage converter CVP group (CVP1 and CVP2), a selection circuit DEC (address decoder, for example) for selecting them, and a subblock group (b11 and b12) that configures a circuit block BL. Each subblock is a circuit which selects a specific word line from a large number of world lines in the case of, for example, the word lines (corresponding to OUT in the figure) lying in a memory array and supplies a voltage pulse to the selected word line. Alternatively, when a main circuit (sub core) comprised of a logical circuit is taken, the subblock is a power switch circuit which supplies a source or power supply voltage to the selected sub core or blocks or cuts off it. The power switch circuit will now be taken as an example. In a logical circuit block, large leakage current that flows within a block BL upon its deactivation or standby must be cut. To this end, a system is well known which subdivides the block into subblocks and controls a source voltage of each subdivided subblock. That is, attention is given to a certain subblock. Since there exit a time zone or period free of the need to supply the source voltage and a time period that needs its supply, the power of the sub core is turned off in the former time period, whereas the power thereof is turned on in the latter time period. Thus, a normal logical operation is enabled while suppressing the leakage current. Since, however, pMOSTs (MB1 and MB2) each of which controls the source voltage of each subblock, become extremely large to cause a large current to flow upon the activation of the sub core, their gate capacitances become large and hence power for driving such MOSTs become large. Therefore, such a circuit as shown in FIG. 25A capable of driving the gates thereof by an input (IN) signal corresponding to a small amplitude signal is desired. Here, the number of subblocks is assumed to be two for simplicity of explanation. Addresses with many subblocks being numbered are used as inputs in the address decoder DEC. However, assume here that two subblocks are selected as a pair and gate inputs (G1) of input MOSTs M1 of two voltage converters have been decoded to select one from the two subblocks. Upon the deactivation of the circuit, the leakage current of the entire circuit becomes so small that it may be ignored. This is because any of the decoder DEC unit, voltage converter CVP unit and block BL unit can suppress the leakage current smaller. That is, in the DEC unit, precharge MOSTs M0 are on and all of their input signals (a1, a2 and a3) are normally 0V. Thus, even if $V_T$ of MOSTs that input the input signals are small, their leakage currents are reduced by vertical stack effects based on the appearance of source voltages (δ1 and δ2 in the figure). Since the inputs of the input MOSTs M1 lying within the CVP1 and CVP2 are $V_{DD}$ and their gates (G1) are 0V in the input MOSTs M1, they are cut off. No leakage current flows even into each of Mn1 and Mn2 coupled to their corresponding outputs (OUT1 and OUT2). This is because the drains and sources thereof are 0V. Since the power control MOSTs (MB1 and MB2) lying in the block are on and low in $V_T$ at this time, they supply large current to the respective subblocks even at a low voltage $V_{DD}$.

The operation of the circuit will be explained below while taking as an example the case in which upon circuit's activation, MB1 is selectively cut off to stop the supply of power to the subblock b11. When all address inputs are changed from 0V brought up to now to $V_{DD}$, and CK2 and CK1B are respectively brought to $V_{DD}$ and 0V, two subblocks are selected upon circuit's activation and the input IN is discharged to 0V. Subsequently, $V_{DD}$ is applied to G1 that belongs to CVP1 desired to be selected. The corresponding node N1 is discharged and a voltage of $V_{DH}$ is outputted to the output OUT1. Accordingly, a reverse bias is applied between the gate and source of MB1 so that MB1 is cut off, whereby the power of the subblock b11 is shut down. Since G1 that belongs to the non-selected CVP2 remains 0V (i.e., CVP2 remains in a non-selected state), the corresponding MB2 is held on. The present embodiment has an advantage in that the two CVPs can be shared even if the scale of the circuit coupled to the stage prior to the input IN is relatively large. Incidentally, since the input MOST M1 that belongs to CVP2 held in the non-selected state is 0V in its input and low in $V_T$, the leakage current slightly flows therethrough. The leakage current is however so small that it may be ignored as compared with an active current for charging/discharging another node capacitance. When, however, $V_T$ is further reduced to perform a low voltage operation, this leakage current become innegligible. In order to reduce it, the inputs of the plural voltage converters CVPs are separated/isolated from one another without sharing the inputs thereof, only the input of one converter to be selected is brought to 0V, and other inputs may be maintained at $V_{DD}$.

Figure 25B:
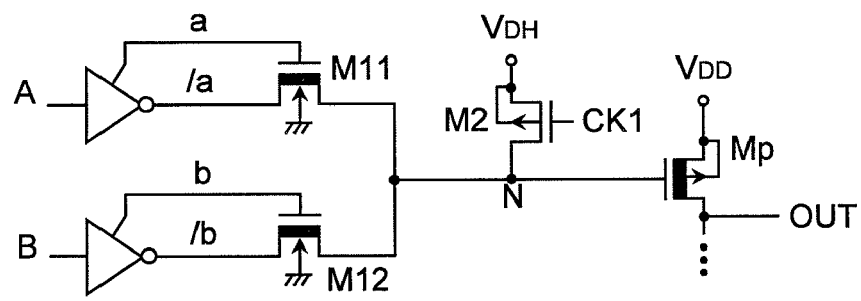
FIG. 25B is an example applied to a NOR circuit.
Figure 25C:
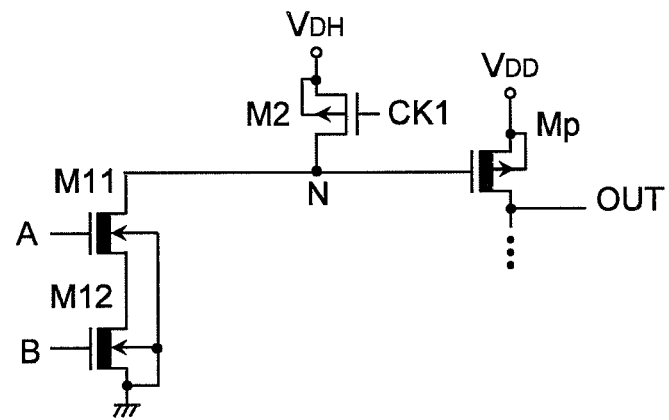
FIG. 25C is an example applied to a NAND circuit.

FIG. 25B is an example in which the input MOST M1 units each lying in FIG. 15A are arranged in parallel. A NOR circuit is obtained wherein its input and output are a $V_{DD}$ amplitude and its inputs are A and B. That is, when the inputs A and B are always 0V upon deactivation of the circuit and at least either one thereof changes to $V_{DD}$ upon its activation, i.e., $V_{DD}$ and 0V are respectively applied to the gate and source of at least one of MOSTs M11 and M12 as inputs, a voltage of $V_{DD}$ is obtained at an output OUT. Since the gates and sources of M11 and M12 are respectively 0V and $V_{DD}$ upon the deactivation, no leakage current flows through both MOSTs. FIG. 25C is a NAND circuit. Only when all inputs are 0V upon its deactivation and all the inputs are changed to $V_{DD}$ upon its activation, a node N is discharged and a voltage of $V_{DD}$ is obtained at an output OUT. Upon the deactivation, the leakage current is reduced by the vertical stack effects referred to above.

Figure 26:
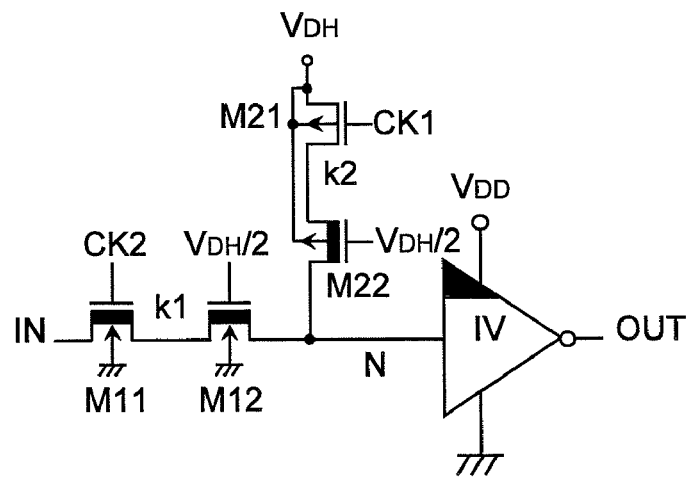
FIG. 26 is an example of an inverter in which MOSTs for relaxing an excessive voltage are added to FIG. 15A.

FIG. 26 is an example in which excessive voltage reduction MOSTs are used in FIG. 15A, for example. When $V_T$ of the enhancement MOST is lowered or $V_T$ of the depletion type is increased as is apparent from FIG. 3, the difference between $V_{DH}$ and $V_{DD}$ becomes large. Since the node N changes from $V_{DH}$ to 0V in FIG. 15A, an excessive $V_{DH}$ voltage is applied between the drain and source of each of M1 and M2, and the excessive voltage $V_{DH}$ is applied even to the gate of each MOST lying in the sub inverter IV, so that the reliability of each MOST is impaired. In order to protect each MOST from the excessive drain-source voltage, each MOST having a gate to which a suitable dc voltage is applied may be inserted in series to an excessive voltage node. M12 and M22 shown in FIG. 26 are MOSTs inserted for the purpose referred to above. Since the node N still remains at $V_{DH}$ or so where IN is 0V in the initial stage of activation at which CK2 is brought to $V_{DD}$, an excessive voltage is applied to the input MOST M1 shown in FIG. 15A. Therefore, a MOST M12 of low $V_T$ (0V) with $V_{DH}/2$ taken as a gate voltage is inserted in series to its corresponding input MOST M11. The voltage of a node k1 is brought to $V_{DH}/2$ until the node N is discharged to $V_{DH}/2$. Thus, the drain-to-source voltage of each of M11 and M12 is reduced to half like $V_{DH}/2$. Similarly, the excessive voltage applied to M2 of FIG. 15A is relaxed by M22 during the period in which the node N is being discharged to 0V. That is, since CK1 is off at $V_{DH}$, a node k2 is brought to $V_{DH}/2$ and hence the drain-to-source voltages of M11 and M12 are respectively brought to $V_{DH}/2$. Similarly, the insertion of such MOSTs is effective even for circuits such as a sub inverter operated at $V_{DH}$. Incidentally, in order to protect each MOST from the excessive gate voltage, the thickness of the gate of each MOST in which $V_{DH}$ is brought to a gate voltage may be made thicker than that of the gate of each MOST in which $V_{DD}$ is brought to a gate voltage. If FIG. 16 is taken for example, then a gate thickness of Mp may be made thicker than that of each MOST coupled to its drain (OUT). In the case of FIG. 15, the gate thicknesses of M21 and each MOST lying in the sub inverter may be thicker than others.

Figure 27:
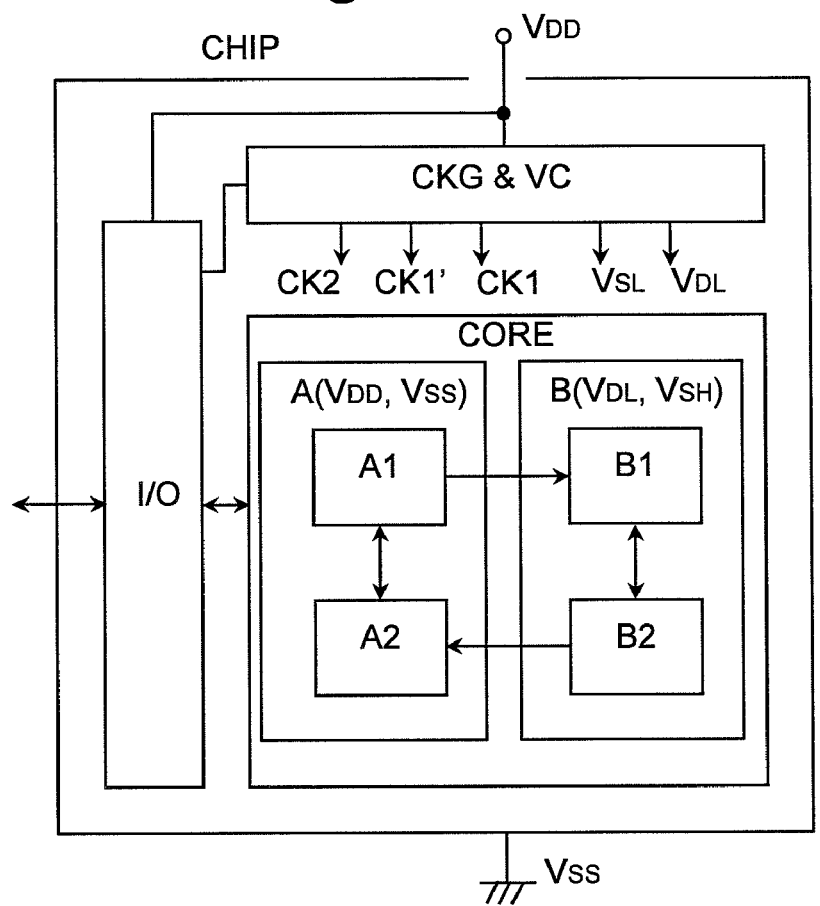
FIG. 27 is a block diagram showing a configuration example of a chip in which small amplitude and large amplitude voltage operations are mixed.
Figure 28A:
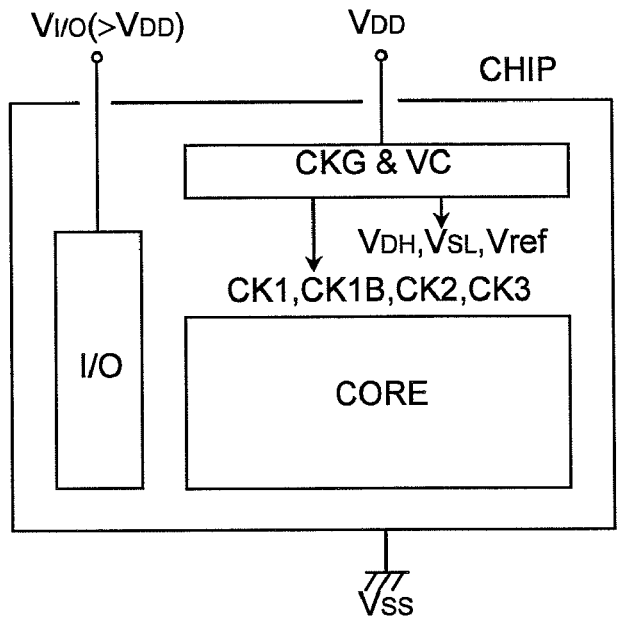
FIG. 28A is a chip in which various operating voltages and clocks are generated.
Figure 29:
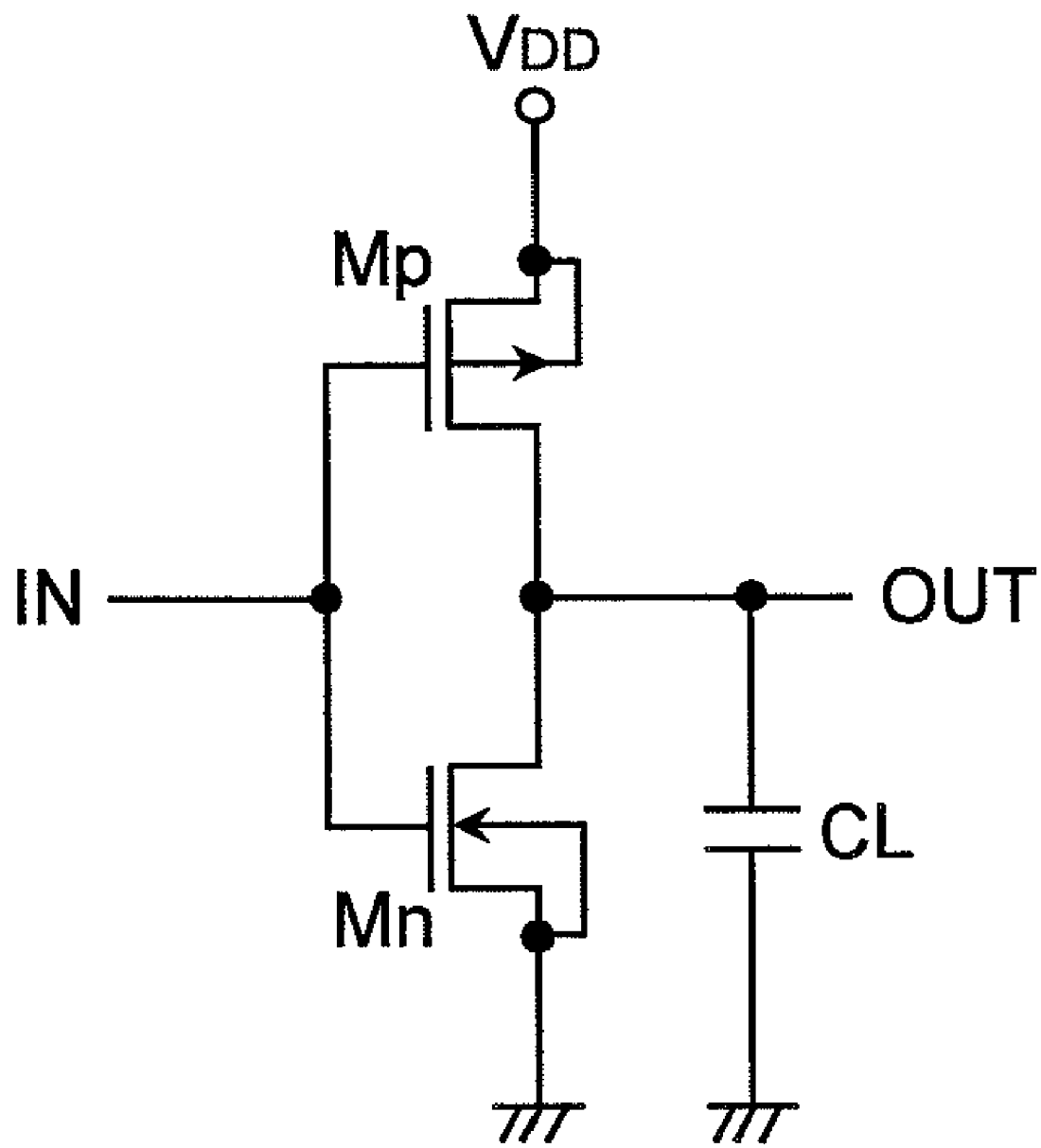
FIG. 29 is a circuit diagram showing a conventional example of a large amplitude voltage operating CMOS circuit.

FIG. 27 is a schematic diagram of an LSI (CHIP) to which the above circuits are applied. The CHIP comprises an interface circuit (I/O) which swaps input/output signals with the outside thereof, a main circuit (CORE) lying thereinside, and a clock generator and a circuit (CKG & VC) for converting an external source voltage $V_{DD}$. The CORE further comprises a circuit group A operated at large amplitude voltages of $V_{DD}$ and $V_{SS}$, and a circuit group B operated at small amplitude voltages of $V_{DL}$ and $V_{SH}$. The circuit group A comprises separate circuits, e.g., A1 and A2 small in load capacitance, thus originally small in power consumption. Thus, since those separate circuits are allowed to operate with large voltage amplitude in terms of power consumption, such a conventional CMOS circuit as shown in FIG. 29 is used as it is. On the other circuit, the circuit group B comprises separate circuits, e.g., B1 and B2 large in load capacitance, thus originally large in power consumption. Thus, since those separate circuits must be operated with small voltage amplitude in terms of power consumption, the circuits employed in the embodiments from FIG. 2 to FIG. 14 or the circuits from FIG. 15 to FIG. 26 can be used for any purpose. Incidentally, the CORE' of FIG. 28A shows the circuit group B per se or its part. The circuit of FIG. 11 can be used to perform the transfer of signals from A1 lying in the circuit group A to B1 lying in the circuit group B. The circuit of FIG. 10 can be used to perform the transfer of signals from B2 to A2.

Figure 28B:
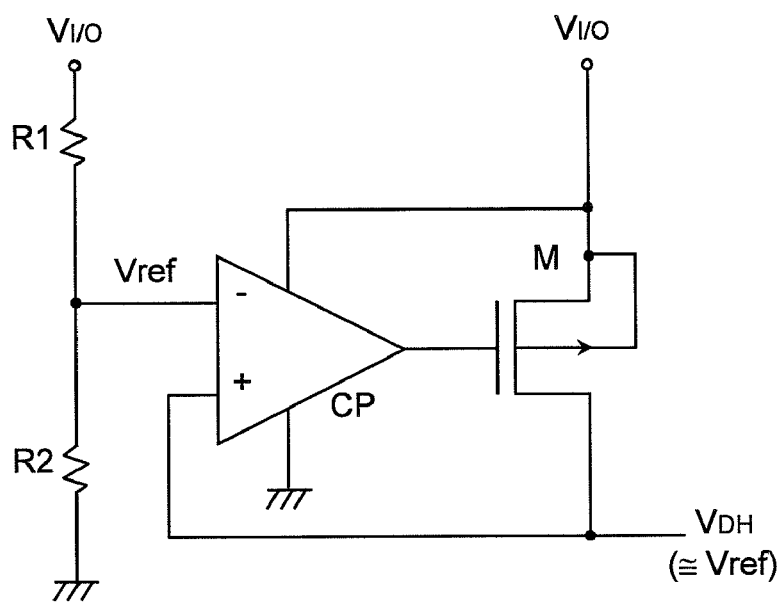
FIG. 28B is a circuit example for generating a step-down source voltage from a source voltage of an I/O circuit unit.

FIG. 28A is a schematic diagram of an LSI in which external power sources or power supplies are two ($V_{DD}$ and $V_{I/O}$). The source voltage $V_{I/O}$ considerably higher than $V_{DD}$ is normally applied to an interface I/O. Power supplies of an internal main circuit (CORE) are three ($V_{DD}$, $V_{DH}$ and $V_{SL}$). As for $V_{DH}$, $V_{I/O}$ is used as it is or a source voltage stepped down from $V_{I/O}$ by a step-down power circuit (circuit which uses a reference voltage Vref, a comparator CP and a pMOST M as for an output stage as shown in FIG. 28B) is used therefor. Since a load driving current is large in this type of step-down power circuit as well known, it is effective for such a circuit that large current flows through $V_{DH}$. If $V_{DH}$ does not require the large current, then $V_{DD}$ is stepped up or raised by the known charge pump circuit using the capacitor and the stepped-up $V_{DD}$ can also be used as the $V_{DH}$ power supply. The negative voltage $V_{SL}$ can be generated from $V_{DD}$ or $V_{I/O}$ by the charge pump circuit. Since $V_{DD}$ can also be produced from $V_{I/O}$, a single power supply operation of $V_{I/O}$ is enabled in this case.

While the invention made above by the present inventors has been described specifically on the basis of the preferred embodiments, the present invention is not limited to the embodiments referred to above. It is needless to say that

What is claimed is:

1. A CMOS circuit comprising:
a plurality of MOSTs constructed such that when their gates and sources are respectively set to an equal voltage, subthreshold leakage currents substantially flow between their drains and sources,
wherein at least one of the MOSTs has a first operation mode and a second operation mode,
wherein in the first operation mode, a constant voltage which is independent of an input voltage of the CMOS circuit is applied to the gate of said at least one MOST in such a manner that a reverse bias is applied between the gate and source of said MOST, and
wherein in the second operation mode, the gate voltage is controlled to two states, selectively, according to the input voltage of the CMOS circuit, the two states including a state in which the reverse bias state is held and a state in which a forward bias is applied between the gate and source.

2. The CMOS circuit according to claim 1,
wherein the constant voltage is higher than a source voltage of said MOST when the MOST is a p-channel MOST, and
wherein the constant voltage is a negative voltage when said MOST is an n-channel MOST.

3. The CMOS circuit according to claim 1, wherein in the second operation mode the circuit is operated at voltages corresponding to two power supplies.

4. The CMOS circuit according to claim 1, wherein a voltage swing of the drain of the MOST in the second operation mode is smaller than that of the gate of the MOST.

5. The CMOS circuit according to claim 1,
wherein the CMOS circuit comprises a first MOST constructed such that when the gate and source thereof are respectively set to an equal voltage, a subthreshold leakage current substantially flows between the drain and source thereof, and a second MOST constructed such that when the gate and source thereof are respectively set to the equal voltage, the subthreshold leakage current does not flow, and
wherein the drain of the first MOST and the drain of the second MOST are coupled to each other.

6. The CMOS circuit according to claim 1,
wherein said MOST is a first MOST having a small-amplitude threshold voltage,
wherein the CMOS circuit comprises the first MOST and a second MOST having a large-amplitude threshold voltage, and
wherein the reverse bias state is controlled by the second MOST.

7. A semiconductor device comprising:
a plurality of MOSTs having different in threshold voltages; and
an output stage including a MOST having a small-amplitude threshold voltage,
wherein the output stage includes the CMOS circuit according to claim 6, and
wherein a voltage swing of a load of the output stage in the second mode is smaller than a gate voltage swing of a MOST that configures the output stage in the second operation mode.

8. The CMOS circuit according to claim 1,
wherein said MOST is a first MOST having a small-amplitude threshold voltage,
wherein the CMOS circuit includes the first MOST and a second MOST having a large-amplitude threshold voltage, which is operated at a high voltage, and
wherein a gate voltage of the first MOST is controlled by a drain voltage of the second MOST.

9. The CMOS circuit according to claim 1, wherein the two states of the second operation mode are controlled by stepping up an input voltage using a MOS capacitor.

10. A semiconductor device comprising:
an input stage and an output stage each comprised of a plurality of MOSTs having different threshold voltages,
wherein the output stage includes a CMOS circuit according to claim 1, and
wherein a MOST having a small-amplitude threshold voltage, and which is coupled to the input stage, is configured to discriminate an input voltage.

11. The semiconductor device according to claim 10, further comprising:
a plurality of circuits each having the input stage and the output stage,
wherein the MOST of the input stage is configured to select the circuit equipped with the input stage and the output stage.

12. The semiconductor device according to claim 11, comprising:
a plurality of circuit blocks,
wherein MOSTs each having a small-amplitude threshold voltage, and which control supply of source voltages of the circuit blocks, are coupled to power supplies of the respective circuit blocks, and
wherein gates of the MOSTs are respectively coupled to the output stages.

13. The CMOS circuit according to claim 1, wherein at least a gate voltage of the MOST is controlled via a MOST having a gate to which a dc voltage is applied.

14. A CMOS circuit comprising:
a plurality of MOSTs constructed such that when their gates and sources are respectively set to an equal voltage, subthreshold leakage currents substantially flow between their drains and sources,
wherein at least one of the MOSTs has a first operation mode and a second operation mode,
wherein in the first operation mode, a constant voltage which is independent of an input voltage of the CMOS circuit is applied to the gate of said at least one MOST in such a manner that a forward bias is applied between the gate and source of said MOST, and
wherein in the second operation mode, the gate voltage is controlled to two states, selectively, according to the input voltage of the CMOS circuit, the two states including a state in which the forward bias state is held and a state in which a reverse bias is applied between the gate and source.

* * * * *